US007778815B2

(12) United States Patent
Pasricha et al.

(10) Patent No.: US 7,778,815 B2
(45) Date of Patent: Aug. 17, 2010

(54) METHOD FOR THE FAST EXPLORATION OF BUS-BASED COMMUNICATION ARCHITECTURES AT THE CYCLE-COUNT-ACCURATE-AT-TRANSACTION-BOUNDARIES (CCATB) ABSTRACTION

(75) Inventors: Sudeep Pasricha, Irvine, CA (US); Nikil Dutt, Irvine, CA (US); Mohamed Ben-Romdhane, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 1223 days.

(21) Appl. No.: 11/139,370

(22) Filed: May 26, 2005

(65) Prior Publication Data

US 2006/0282233 A1    Dec. 14, 2006

(51) Int. Cl.
     *G06F 13/12*      (2006.01)
(52) U.S. Cl. .............................. 703/22; 703/13; 703/14; 703/119; 703/20; 703/21; 716/4; 716/6
(58) Field of Classification Search ..................... 703/1, 703/15, 13, 14, 19–22, 18; 716/1, 5, 14, 716/18, 4, 6
See application file for complete search history.

(56) References Cited

U.S. PATENT DOCUMENTS

| | | | | |
|---|---|---|---|---|
| 5,913,043 | A * | 6/1999 | Carter et al. ................. | 710/100 |
| 5,953,519 | A * | 9/1999 | Fura ............................ | 716/18 |
| 5,958,035 | A * | 9/1999 | Carter et al. ................. | 710/306 |
| 5,996,034 | A * | 11/1999 | Carter ......................... | 710/100 |
| 6,442,514 | B1 * | 8/2002 | Le ............................... | 703/21 |
| 6,609,221 | B1 * | 8/2003 | Coyle et al. ................. | 714/715 |
| 6,993,469 | B1 * | 1/2006 | Bortfeld ...................... | 703/15 |
| 6,996,515 | B1 * | 2/2006 | Foltin et al. .................. | 703/19 |
| 7,050,958 | B1 * | 5/2006 | Bortfeld et al. .............. | 703/15 |
| 7,069,204 | B1 * | 6/2006 | Solden et al. ................ | 703/14 |
| 7,283,944 | B2 * | 10/2007 | Tsai et al. ..................... | 703/15 |

(Continued)

OTHER PUBLICATIONS

K. Lahiri, A. Raghunathan, S. Dey, "Efficient Exploration of the SoC Communication Architecture Design Space" 2000 IEEE, pp. 424-430.*

(Continued)

*Primary Examiner*—Kamini S Shah
*Assistant Examiner*—Kibrom Gebresilassie
(74) *Attorney, Agent, or Firm*—Daniel L. Dawes; Marcus C. Dawes

(57) ABSTRACT

A computer system simulation method starts with algorithmically implementing a specification model independently of hardware architecture. High level functional blocks representing hardware components are connected together using a bus architecture-independent generic channel. The bus architecture-independent generic channel is annotated with timing and protocol details to define an interface between the bus architecture-independent generic channel and functional blocks representing hardware components. The interface is refined to obtain a CCATB for communication space. The read( ) and write( ) interface calls are decomposed into several method calls which correspond to bus pins to obtain observable cycle accuracy for system debugging and validation and to obtain a cycle accurate model. The method calls are replaced by signals, and the functional blocks representing hardware components are further refined to obtain pin/cycle-accurate models which can be manually or automatically mapped to RTL, or be used to co-simulate with existing RTL components.

38 Claims, 19 Drawing Sheets

U.S. PATENT DOCUMENTS

| | | | |
|---|---|---|---|
| 7,331,031 B2 * | 2/2008 | Nation et al. | 716/18 |
| 2004/0054500 A1 * | 3/2004 | Beverly et al. | 702/182 |
| 2005/0022143 A1 * | 1/2005 | Butts et al. | 716/5 |
| 2005/0091026 A1 * | 4/2005 | Hodgson et al. | 703/22 |
| 2005/0131666 A1 * | 6/2005 | Tsai et al. | 703/17 |
| 2005/0229170 A1 * | 10/2005 | Bellantoni et al. | 717/165 |
| 2006/0052995 A1 * | 3/2006 | Odagawa et al. | 703/14 |
| 2006/0080076 A1 * | 4/2006 | Lahiri et al. | 703/18 |
| 2006/0200788 A1 * | 9/2006 | Nation et al. | 716/18 |
| 2006/0282586 A1 * | 12/2006 | Shibuya | 710/110 |
| 2007/0168893 A1 * | 7/2007 | Watanabe et al. | 716/3 |

OTHER PUBLICATIONS

S. Pasricha, M. B. Romdhane, N. Dutt, "High Level Design Space Exploration of Shared Bus Communication Architectures" Mar. 13, 2004, pp. 1-15.*

W. Klingauf, "Ststematic Transaction Level Modeling of Embedded Systems with SystemC" Mar. 2005 IEEE, pp. 1-2.*

L. Cai, D. Gajski, "Transaction Level Modeling: An Overview" ACM 2003, pp. 19-24.*

S. Mahadevan, F. Angiolini, M. Storgaard, R. G. Olsen, J. Sparso, J. Madsen, "A Network Traffic Generator Model for Fast Network-on-Chip Simulation", IEEE 2005, pp. 1-6.*

Center for Embedded Computer Systems Univeristy of California, Irvine, Technical Reports Published in 2004, http://www.cecs.uci.edu/pub_tech_2004.htm, 2004.*

CECS eNEWS, vol. 4, Issue 2, Apr. 2004, p. 1-7.*

W. Klingauf, "Systematic Transaction Level Modeling of Embedded systems with SystemC", pp. 1-2, Mar. 2005.*

I. Moussa, T. Grellier, and G. Nguyen, "Exploring SW Performance Using SoC Transaction Level Modeling", pp. 97-109, 2003.*

K. Lahiri, A. Raghunathan, S. Dey, "Fast Performance Analysis of Bus-Based System-On-Chip Communication", pp. 566-572, IEEE 1999.*

"Extending the Transaction Level Modeling Approach for Fast Communication Architecture Exploration" by Pasricha et. al., DAC'04, Jun. 7-11, 2004, San Diego, California.

"Fast Exploration of Bus-based On-chip Communication Architectures" by Pasricha et.al., CODES+ISSS'04, Sep. 8-10, 2004, Stockholm, Sweden.

"Transaction level modeling of SoC with SystemC 2.0" by Pasricha, Synopsys User Group Conference (SNUG 2002), Bangalore, India, May 2002.

"Rapid Exploration of Bus-based Communication Architectures at the CCATB Abstraction" by Pasricha et.al., CECS Technical Report #04-11, May 2004.

* cited by examiner

CYCLE ACCURATE (CA)

PIN ACCURATE BUS CYCLE ACCURATE (PA-BCA)

TRANSACTION BASED BUS CYCLE ACCURATE (T-BCA)

METHOD FOR THE FAST EXPLORATION OF BUS-BASED COMMUNICATION ARCHITECTURES AT THE CYCLE-COUNT-ACCURATE-AT-TRANSACTION-BOUNDARIES (CCATB) ABSTRACTION

GOVERNMENT SUPPORT

This invention was made with Government support under Grant Nos. CCR-0203813 and CCR-0205712, awarded by the National Science Foundation. The Government has certain rights in this invention.

BACKGROUND OF THE INVENTION

1. Field of the Invention

The invention relates to the field of computer design and in particular to methods and apparatus for designing the communication protocol among a plurality of computer components of a system on a chip.

2. Description of the Prior Art

System-on-Chip (SoC) designs are becoming increasingly more complex, with more and more components being integrated into a single SoC design. Communication between these components is increasingly dominating critical system paths and frequently becomes the source of performance bottlenecks. It therefore becomes imperative for designers to explore the communication space early in the design flow. Traditionally, system designers have used pin-accurate Bus Cycle Accurate (PA-BCA) models for early communication space exploration. These models capture all of the bus signals and strictly maintain cycle accuracy, which is useful for exploration of the degree of reliable performance, but results in slow simulation speeds for complex designs, even when they are modeled using high level languages.

Recently there have been several efforts to use the Transaction Level Modeling (TLM) paradigm for improving simulation performance in BCA models. However, these transaction based BCA (T-BCA) models capture a lot of details that can be eliminated when exploring communication architectures.

SoC designs today have several components (central processing units (CPUs), digital signal processors (DSPs), memories, peripherals etc.) which share the processing load and frequently exchange data with each other. It therefore becomes imperative for system designers to focus on exploring the communication space quickly, reliably and early in the design flow to make the right choices and eliminate performance bottlenecks under time-to-market pressures.

Shared-bus based communication architectures such as AMBA, CoreConnect, WishBone and OCP are popular choices for on-chip communication between components in current SoC designs. These bus architectures can be configured in several different ways, resulting in a vast exploration space that is prohibitive to explore at the register transfer level (RTL) level. Not only is the RTL simulation speed too slow to allow adequate coverage of the large design space, but making small changes in the design can require considerable re-engineering effort due to the highly complex nature of these systems.

To overcome these limitations, system designers have raised the abstraction level of system models. FIG. 1 is a symbolic diagram which shows the frequently used modeling abstraction levels for communication space exploration, usually captured with high level languages such as C/C++. These high level models give an early estimate of the system characteristics before committing to RTL development. In Cycle Accurate (CA) models, system components (both masters and slaves) and the bus architecture are captured at a cycle and signal accurate level. While these models are extremely accurate, they are too time-consuming to model and only provide a moderate speedup over RTL models. Bus Cycle Accurate (BCA) models capture the system at a higher abstraction level than Cycle Accurate (CA) models. Components are modeled at a less detailed behavioral level, which allows rapid system prototyping and considerable simulation speed over RTL. The component interface and the bus however are still modeled at a cycle and signal accurate level, which enables accurate communication space exploration. However, with the increasing role of embedded software and rising design complexity, even the simulation speedup gained with BCA models is not enough.

Recent research efforts have focused on using concepts found in the Transaction Level Modeling (TLM) domain to speed up BCA model simulation. Transaction Level Models are very high level bit-accurate models of a system with specifics of the bus protocol replaced by a generic bus (or channel), and where communication takes place when components call read( ) and write( ) methods provided by the channel interface. Since detailed timing and signal-accuracy is omitted in TLM, these models are fast to simulate and are useful for early embedded software development and functional validation of the system. Transaction based BCA (T-BCA) models make use of the read/write function call interface, optionally with a few signals to maintain bus cycle accuracy. The simpler interface reduces modeling effort and the function call semantics result in faster simulation speeds. However these approaches do not fully exploit the potential for speedup when modeling systems for exploring on-chip communication tradeoffs and performance.

Since detailed timing and pin-accuracy is omitted in Transaction Level Models, these models are fast to simulate and are useful for early functional validation of the system. Others have also proposed a top-down system design methodology with four models at different abstraction levels. The architecture model in their methodology corresponds to the TLM level of abstraction while the next lower abstraction level (called the communication model) is a BCA model where the generic channel has been replaced by bit and timing accurate signals corresponding to a specific bus protocol.

Early work with TLM established SystemC 2.0 as the modeling language of choice for the approach. We have previously described how TLM can be used for early system prototyping and embedded software development. Others have defined a system level exploration platform for network processors which need to handle high speed packet processing. The SOCP channel described in their approach is based on OCP semantics and is essentially a simple TLM channel with a few added details such as support for split transactions. It has also been proposed that a component based bottom-up system design methodology be provided where components modeled at different abstractions are connected together with a generic channel like the one used in TLM, after encapsulating them with suitable wrappers. Commercial tools such as the Incisive Verification Platform, ConvergenSC System Designer and Cocentric System Studio have also started adding support for system modeling at the higher TLM abstraction, in addition to lower level RTL modeling.

Recently, research efforts have focused on adapting TLM concepts to speed up architecture exploration. Some researchers have used function calls instead of slower signal semantics to describe models of AMBA2 and CoreConnect bus architectures at a high abstraction level. However, the resulting models are not detailed enough for accurate communication exploration. Others have made a similar attempt to model AMBA2 using function calls for reads/writes on the bus, but also model certain bus signals and make extensive use of SystemC clocked threads which can slow down simulation. Researchers have also proposed model data transfers in AMBA2 using read/write transactions but use low level handshaking semantics in the models which need not be explicitly modeled to preserve cycle accuracy. Recently, ARM released the AHB Cycle-Level Interface Specification which provides the definition and compliance requirements for modeling AHB at a cycle-accurate level in SystemC. Function calls are used to replace all bus signals at the interface between components and the bus.

What is needed is an approach for a faster transaction-based modeling abstraction level (CCATB) to explore the communication design space.

BRIEF SUMMARY OF THE INVENTION

The illustrated embodiment extends the TLM approach to provide a faster transaction-based modeling abstraction level (CCATB) to explore the communication design space. The methodology of the invention presents an abstraction level which bridges the gap between the TLM and BCA levels to speed up system prototyping and more importantly simulation performance, while maintaining cycle count accuracy. CCATB models yield an average performance speedup of 120% over PA-BCA and 67% over T-BCA models.

We describe below the mechanisms behind the speedup and present a simulation implementation of the CCATB modeling abstraction, for high performance shared bus architectures. To underline the effectiveness of our approach, we describe exploration embodiments involving typical commercial SoC designs in the broadband communication and multimedia systems. We also compare simulation performance and modeling effort for CCATB, PA-BCA and T-BCA models and analyze the scalability of these approaches with design complexity.

The illustrated embodiment is a modeling abstraction level defined here as Cycle Count Accurate at Transaction Boundaries (CCATB) for on-chip communication space exploration.

The invention is illustrated as a method for exploring performance of a communication protocol in a computer system having a plurality of components comprising the steps of: selecting a communication architecture; configuring the communication architecture to meet design performance requirements; simulating performance of all of the plurality of components combined in the computer system with the selected communication architecture at a transaction-based modeling abstraction level using a Cycle Count Accurate at Transaction Boundaries (CCATB) model.

The step of configuring the communication architecture to meet design performance requirements comprises the step of configuring bus topology, data bus width, arbitration protocols, direct memory access (DMA) burst lengths or buffer sizes to meet design performance requirements.

The step of simulating performance of all of the plurality of components comprises the step of modeling CPUs, memories and peripherals in the computer system with appropriate parameters, annotated with timing details and modeled at a granularity which captures the functionality of the CPUs, memories and peripherals.

The step of simulating performance of all of the plurality of components comprises the step of modeling performance bus features such as pipelined operation, hierarchy, SPLIT/RETRY transactions, Out-of-Order transaction completion, burst modes, exclusive (semaphore) access or protection modes.

The step of modeling performance bus features comprises the step of modeling performance components at different abstraction levels by use of an appropriate wrapper to interface with the Cycle Count Accurate at Transaction Boundaries (CCATB) model.

The computer system includes a CPU architecture. The step of modeling performance components comprises the step of simulating the working of the computer system including running embedded software on a corresponding CPU architecture model.

The method further comprises the step of reusing modeled components to amortize design effort over a range of architecture derivatives.

The step of modeling performance components at different abstraction levels by use of an appropriate wrapper to interface with the Cycle Count Accurate at Transaction Boundaries (CCATB) model comprises the step of modeling performance components independently of the underlying architecture to allow plug-and-play of a plurality of on-chip communication architectures.

The step of simulating performance of all of the plurality of components combined in the computer system comprises the step refining higher level (timing-independent) TLM models to lower level cycle/pin-accurate models, and avoiding modeling protocol signals due to simulation overhead.

The step of simulating performance of all of the plurality of components combined in the computer system with the selected communication architecture at a transaction-based modeling abstraction level using a Cycle Count Accurate at Transaction Boundaries (CCATB) model comprises the step of simulating performance of a read or write operation issued by a master to a slave, that can either be a single data word or a multiple data burst transfer.

The step of simulating performance of a read or write operation comprises the step of passing bus protocol specific control and timing information.

The step of simulating performance of all of the plurality of components comprises the step of maintaining cycle count accuracy at transaction boundaries.

The step of maintaining cycle count accuracy at transaction boundaries comprises the step of maintaining the number of bus cycles that elapse at the end of a transaction the same as when compared to cycles elapsed in a detailed cycle/pin accurate system model.

The step of maintaining the number of bus cycles comprises the step of maintaining overall cycle count accuracy needed to gather statistics for accurate communication space exploration, while optimizing the models for simulation.

The step of simulating performance of all of the plurality of components comprises the step of simulating performance of all of the plurality of components using SystemC modeling language.

The step of simulating performance of all of the plurality of components comprises the step of simulating performance bus architectures by extending a generic TLM channel model to include bus architecture specific timing and protocol details, integrating arbiter and decoder modules with the channel model, and modeling computation blocks (masters and slaves) at a behavioral abstraction level.

The step of modeling computation blocks (masters and slaves) at a behavioral abstraction level comprises the step of refining a master IP by setting protocol specific parameters before calling interface functions.

The slaves have a slave IP. The step of modeling computation blocks (masters and slaves) at a behavioral abstraction level comprises the step of adding model refinement when the slave IP supports special bus protocol specific features, such as having an outstanding instruction queue for out-of-order transaction completion in the AXI protocol.

The slaves have a slave IP with an interface, and the masters have a master IP with a different interface. The step of modeling computation blocks (masters and slaves) at a behavioral abstraction level comprises the step of using an adapter to interface the different interfaces.

The computer system comprises a plurality of computer subsystems coupled by a plurality of bridges. The step of selecting a communication architecture comprises the step of selecting a communication architecture defined by the plurality of computer subsystems coupled by the plurality of bridges.

The step of simulating performance of all of the plurality of components combined in the computer system comprises the step of simulating performance during which unnecessary invocation of simulation components is prevented and during which idle time is efficiently handled.

The step of simulating performance during which unnecessary invocation of simulation components is prevented and during which idle time is efficiently handled comprises the step of handling all the delays in a transaction in a bus module without repeatedly invoking other parts of the computer system on every cycle (master and slave threads and processes) which would otherwise contribute to simulation overhead.

The invention can also be embodied as a method for exploring performance of a communication protocol in a computer system having a plurality of components comprising the steps of: algorithmically implementing a specification model of the computer system independently of hardware architecture eventually used to implement the algorithmic implementation; connecting together high level functional blocks representing hardware components using a bus architecture-independent generic channel for early embedded software development and high-level platform validation; annotating the bus architecture-independent generic channel with timing and protocol details to define an interface between the bus architecture-independent generic channel and functional blocks representing hardware components; refining the interface to obtain a CCATB for communication space and system performance exploration; decomposing read( ) and write( ) interface calls into several method calls which correspond to bus pins to obtain observable cycle accuracy for system debugging and validation and to obtain a cycle accurate model; and replacing the method calls by signals and further refining the functional blocks representing hardware components to obtain pin/cycle-accurate models which can be manually or automatically mapped to RTL, or be used to co-simulate with existing RTL components for better simulation performance while validating system design at a low level.

The step of decomposing read( ) and write( ) interface calls comprises the step of passing bus-architecture specific control information through the read( ), write( ) channel interface.

The invention is also embodied in an apparatus for implementing the forgoing methods in a computer system.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

Figure 1:
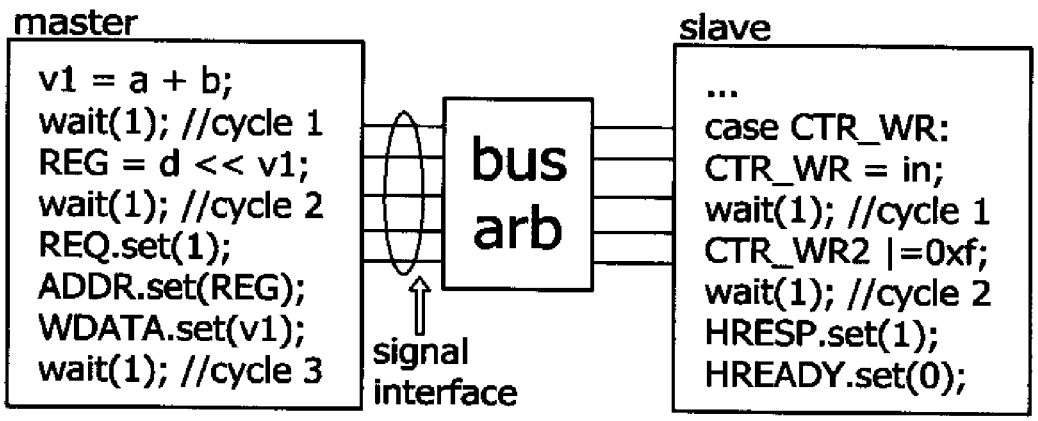
FIG. 1 is a block diagram symbolically showing prior art modeling abstractions for exploration.
Figure 1:
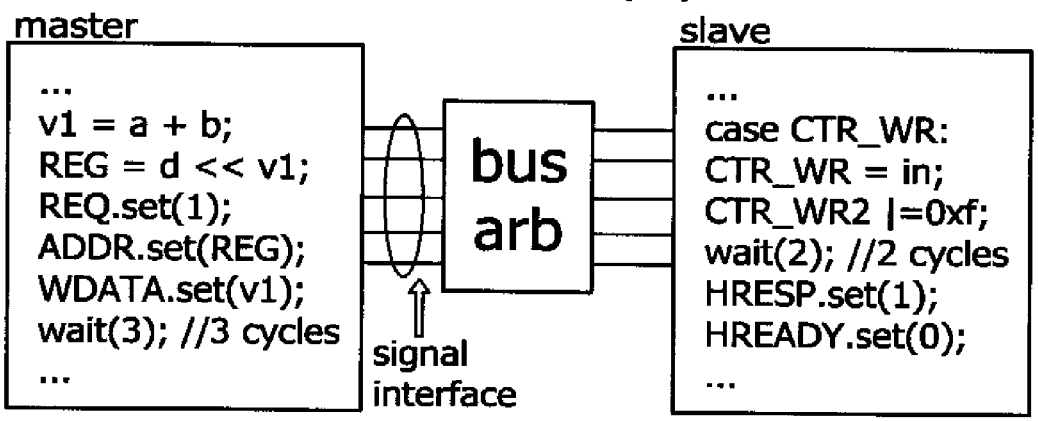
Figure 1:
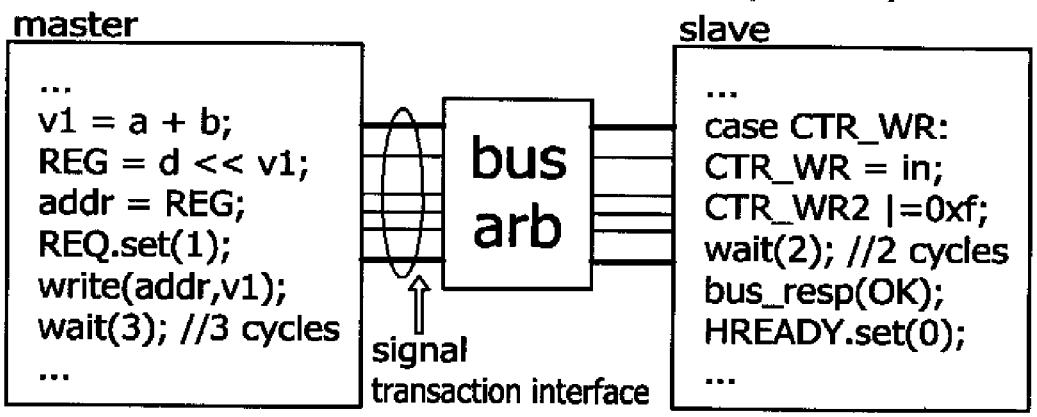

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

Requirements for Communication Space Exploration

First consider some of the requirements for communication space exploration. After system designers have performed hardware/software partitioning and architecture mapping in a typical design flow, they need to select a communication architecture for the design. The selection is complicated by the plethora of choices with which a designer is confronted. Factors such as application domain specific communication requirements and reuse of the existing design intellectual property (IP) library play a major role in this selection process.

Once a choice of communication architecture is made, the next challenge is to configure the architecture to meet design performance requirements. Bus-based communication architectures such as AMBA have several parameters which can be configured to improve performance: bus topology, data bus width, arbitration protocols, direct memory access (DMA) burst lengths and buffer sizes have significant impact on system performance and must be considered by designers during exploration. In the illustrated embodiments presented here, we use our approach to select an appropriate communication architecture and also configure it once the selection process is completed.

Any meaningful exploration effort must be able to comprehensively capture the communication architecture and be able to simulate the effects of changing configurable parameters at a system level. This implies that we need to model the entire system and not just a portion of it. Fast simulation speed is also essential when exploring large designs and the vast design space, in a timely manner. System components such as CPUs, memories and peripherals need to be appropriately parameterized, annotated with timing details and modeled at a granularity which would capture their precise functionality, yet not weigh down simulation speed due to unnecessary detail. Existing components that have been written at different abstraction levels (e.g. pin-accurate interface processor ISS models) should be easily adapted to fit into the framework by writing an appropriate wrapper to interface with our bus model. Performance numbers would then be obtained by simulating the working of the entire system including running embedded software on the CPU architecture model.

An important long-term requirement would be the ease of reuse of these components to amortize design effort over a range of architecture derivatives. Our bus model would be required to support all the advanced high-performance bus features such as pipelined operation, hierarchy, SPLIT/RETRY transactions, Out-of-Order transaction completion, burst modes, exclusive (semaphore) access and protection modes etc. The bus interface to SoC components should be independent of the underlying architecture to allow effortless plug-and-play of different on-chip communication architectures (e.g. AMBA, OCP, CoreConnect etc.). It should also be generic enough to ease refinement from higher level (timing-independent) TLM models to lower level cycle/pin-accurate models, and avoid modeling protocol signals due to simulation overhead. Instead function calls should be used.

Ultimately, the exploration models need to be fast, accurate and flexible, providing good simulation speed, overall cycle accuracy for reliable performance estimation and the flexibility to seamlessly plug-and-run different bus architectures and reuse components such as processors, memories and peripherals.

AMBA: A Typical Bus Architecture

It will be helpful to understanding to consider a typical bus architecture such as AMBA. Bus architectures usually have a separate bus for high performance, high bandwidth components and low bandwidth high latency peripherals. A typical example of one such bus architecture is the AMBA which is one of the most widely used on-chip bus architecture standards used to interconnect components in System-on-chip (SoC) designs. Since we use the AMBA architecture to describe and demonstrate the features and exploration capabilities of CCATB in subsequent sections, we give a brief overview of the standard here. However, it must be expressly understood that the invention is not limited to use with AMBA and that any bus architecture now known or later devised may be advantageously explored with the invention.

The AMBA 2.0 bus architecture consists of the AHB (Advanced High-performance Bus), APB (Advanced Peripheral Bus) and ASB (Advanced System Bus) busses. The AHB bus is used for high bandwidth and low latency communication, primarily between CPU cores, high performance peripherals, DMA controllers, on-chip memories and interfaces such as bridges to the slower APB bus. The APB is used to connect slower peripherals such as timers, universal asynchronous receiver-transmitters (UARTs) etc. and uses a bridge to interface with the AHB. It is a simple bus that does not support the advanced features of the AHB bus. The ASB bus is an earlier version of the high-performance bus which has been superceded by AHB in current designs.

Recently, ARM announced the release of AMBA 3.0 with the next generation of high-performance bus protocol called the Advanced eXtensible Interface (AXI). In the following subsections we give a brief overview of the main features of the high performance bus protocols in AMBA.

AMBA 2.0 AHB

First consider AMBA 2.0 AHB. The Advanced High-Performance Bus (AHB) is a high-speed, high-bandwidth bus that supports multiple masters. AHB supports a multilayer bus architecture to optimize system bandwidth and improve performance. It supports pipelined operations for high speed memory and peripheral access without wasting precious bus cycles. Burst transfers allow optimal usage of memory interfaces by giving advance information of the nature of the transfers. AHB also allows split transactions which maximize the use of the system bus bandwidth by enabling high latency slaves to release the system bus during the dead time while the slave is completing its transaction. In addition, wide bus configurations from 32 up to 1024 bits wide are supported.

AMBA 3.0 AXI

Next consider AMBA 3.0 AXI. The Advanced eXtensible Interface (AXI) has all the advanced features of the AHB bus such as pipelined and burst transfers, multi-master configuration and a wide data bus. In addition, it has support for multiple outstanding transactions and out of order transaction completion, separate read and write channels, unaligned data transfer using byte strobes and improved burst mode operation (only the start address of the burst is broadcast on the address bus). AXI also provides enhanced protection support (secure/non-secure transactions), enhanced system cache/buffer support (pins for specifying write-back/write through attributes and allocation strategies), a FIXED burst mode (for repeated access to the same location) and exclusive access support for semaphore type operations.

CCATB Overview

As the indicated above, bus architectures, such as AMBA, have several parameters which can be configured to improve performance. Our goal is to improve simulation performance for reliable exploration of on-chip communication architectures as early as possible in the design flow.

Modeling Abstraction

To enable fast exploration of the communication design space, we introduce a modeling abstraction level which is "cycle accurate" when viewed at "transaction boundaries". For this reason we define our model for the purposes of this specification and its claims by the phrase, "Cycle Count Accurate at Transaction Boundaries" (CCATB). This, however, is only a convenient reference label and should not be read in any manner as a limitation on the scope of the invention. A transaction in this context refers to a read or write operation issued by a master to a slave, that can either be a single data word or a multiple data burst transfer. Transactions at the CCATB level are similar to transactions at the TLM level except that we additionally pass bus protocol specific control and timing information. Unlike BCA models, we do not maintain accuracy at every cycle boundary. Instead, we raise the modeling abstraction and maintain cycle count accuracy at transaction boundaries i.e. the number of bus cycles that elapse at the end of a transaction is the same when compared to cycles elapsed in a detailed cycle/pin accurate system model. This concept should be compared to conventional Observable Time Windows and used for verifying results of high level synthesis. We maintain overall cycle count accuracy needed to gather statistics for accurate communication space exploration, while optimizing the models for faster simulation. Our approach essentially trades off intra-transaction visibility to gain simulation speedup.

Modeling Language

In the illustrated embodiment we chose SystemC 2.0 to capture designs at the CCATB abstraction level, as it provides a rich set of primitives for modeling communication and synchronization, e.g. channels, ports, interfaces, events, signals and wait-state insertion. Concurrent execution is performed by multiple threads and processes (lightweight threads) and execution schedule is governed by the scheduler. SystemC also supports capture of a wide range of modeling abstractions from high level specifications to pin and timing accurate system models. Since it is a library based on C++, it is object oriented, modular and allows data encapsulation, all of which are essential for easing IP distribution, reuse and adaptability across different modeling abstraction levels.

Component Model Characteristics

Bus architectures in CCATB are modeled by extending the generic TLM channel to include bus architecture specific timing and protocol details. Arbiter and decoder modules are integrated with this channel model. Computation blocks (masters and slaves) are modeled at the behavioral abstraction level, just like TLM models in Sudeep Pasricha, "Transaction Level Modeling of SoC with SystemC 2.0", in *Synopsys User Group Conference (SNUG)*, 2002.

Figure 2:
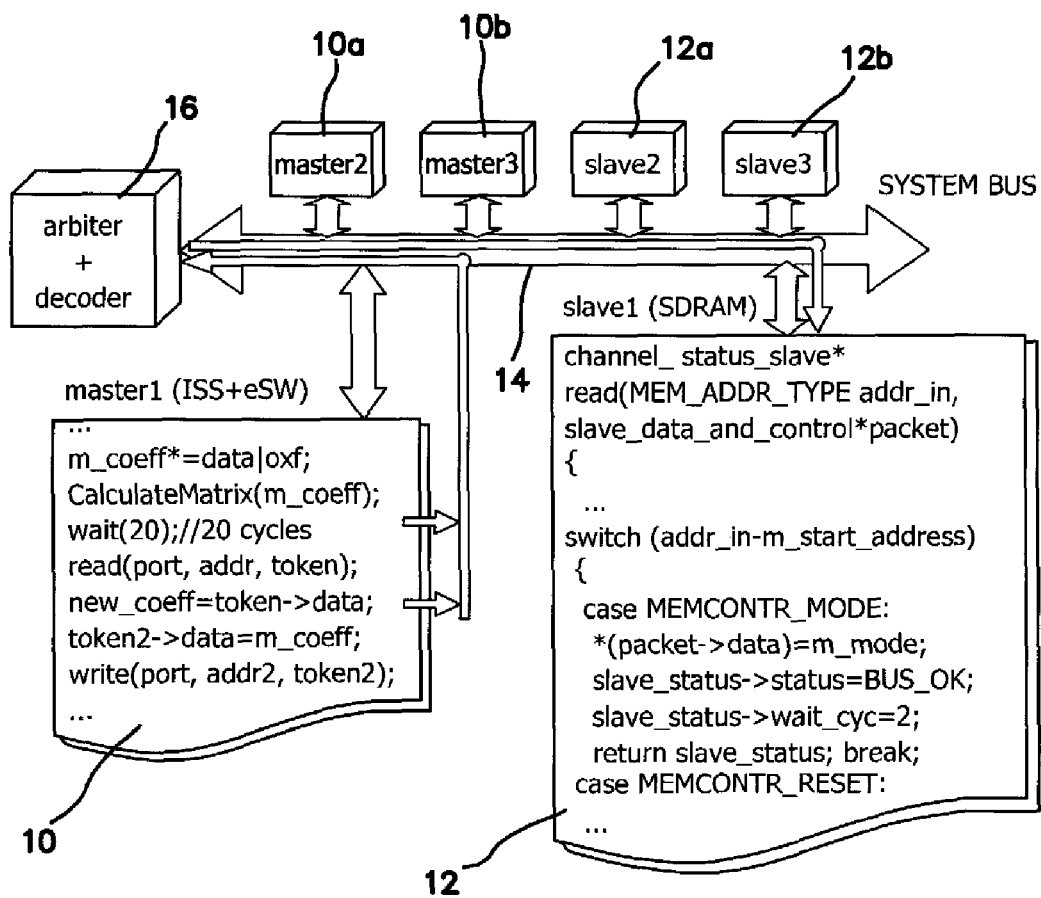
FIG. 2 is a block diagram showing an illustrative example of a CCATB transaction of the invention.

Masters 10 are active blocks with possibly several computation threads and ports to interface with busses. One of our goals was to keep a consistent interface when refining models from the TLM level down to our CCATB level. FIG. 2 is a block diagram which illustrates an interface used by the master 10 to communicate with a slave 12. A plurality of masters 10a, 10b may also be commonly coupled to bus 14 with slaves 12a, 12b. In FIG. 2, the term, "port" specifies the port to send the read/write request on (since a master 10 may be connected to multiple busses 14). "addr" is the address of the slave 12 to which to send the transaction. "Token" is a structure that contains pointers to data and control information. Table 1 shows the fields in this token data structure passed by the master 10 and received by the arbiter 16. The status field in the token structure contains the status of the transaction, as returned by the slave 12. At the TLM level, since the bus 14 is modeled as an abstract channel without including any specific details of the bus protocol, the data_cntrl structure contains just the m_data, m_burst_length and m_byte_enable fields. The other fields are specific to bus protocols and are thus omitted since we are only concerned with transferring data packets from the source to its destination at this level. Thus, when we refine a master IP from the TLM level to the CCATB level, the only change is to set protocol specific parameters before calling the interface functions.

TABLE 1

| Request field | Description |
|---|---|
| m_data | pointer to an array of data |
| m_burst_length | length of transaction burst |
| m_burst_type | type of burst (incr, fixed, wrapping etc.) |
| m_byte_enable | byte enable strobe for unaligned transfers |
| m_read | indicates whether transaction is read/write |
| m_lock | lock bus during transaction |
| m_cache | cache/buffer hints |
| m_prot | protection modes |
| m_transID | transaction ID (needed for OO access) |
| m_busy_idle | schedule of busy/idle cycles from master |
| m_ID | ID for identifying the master |
| status | status of transaction (returned by slave) |

Slaves 12 are passive entities, activated only when triggered by the arbiter 16 on a request from the master 10, and have a register/memory map to handle read/write requests. The arbiter 16 calls read( ) and write( ) functions implemented in the slave 12, as shown illustratively for the SDRAM controller in FIG. 2. An excerpt of the read function from a memory controller in slave 12 is shown in FIG. 2. Slaves 12 can also have optional (lightweight) processes triggered by SystemC events, to perform computation if needed. The functionality of the slave IP remains unchanged when refining the model from the TLM level to the CCATB level, unless the slave IP supports special bus protocol specific features such as having an outstanding instruction queue for out-of-order transaction completion in the AXI protocol, in which case these details need to be added.

In accordance with the principle of Interface Based Design, preexisting master and slave IP modules 10, 12 with different interfaces can be incorporated in the model using an adapter written in SystemC. For instance, we used adapter code written in SystemC in our exploration environment to interface ARM processor ISS models (which are not written in SystemC) with the TLM/CCATB SystemC interface.

Maintaining Cycle Count Accuracy

Figure 3A:
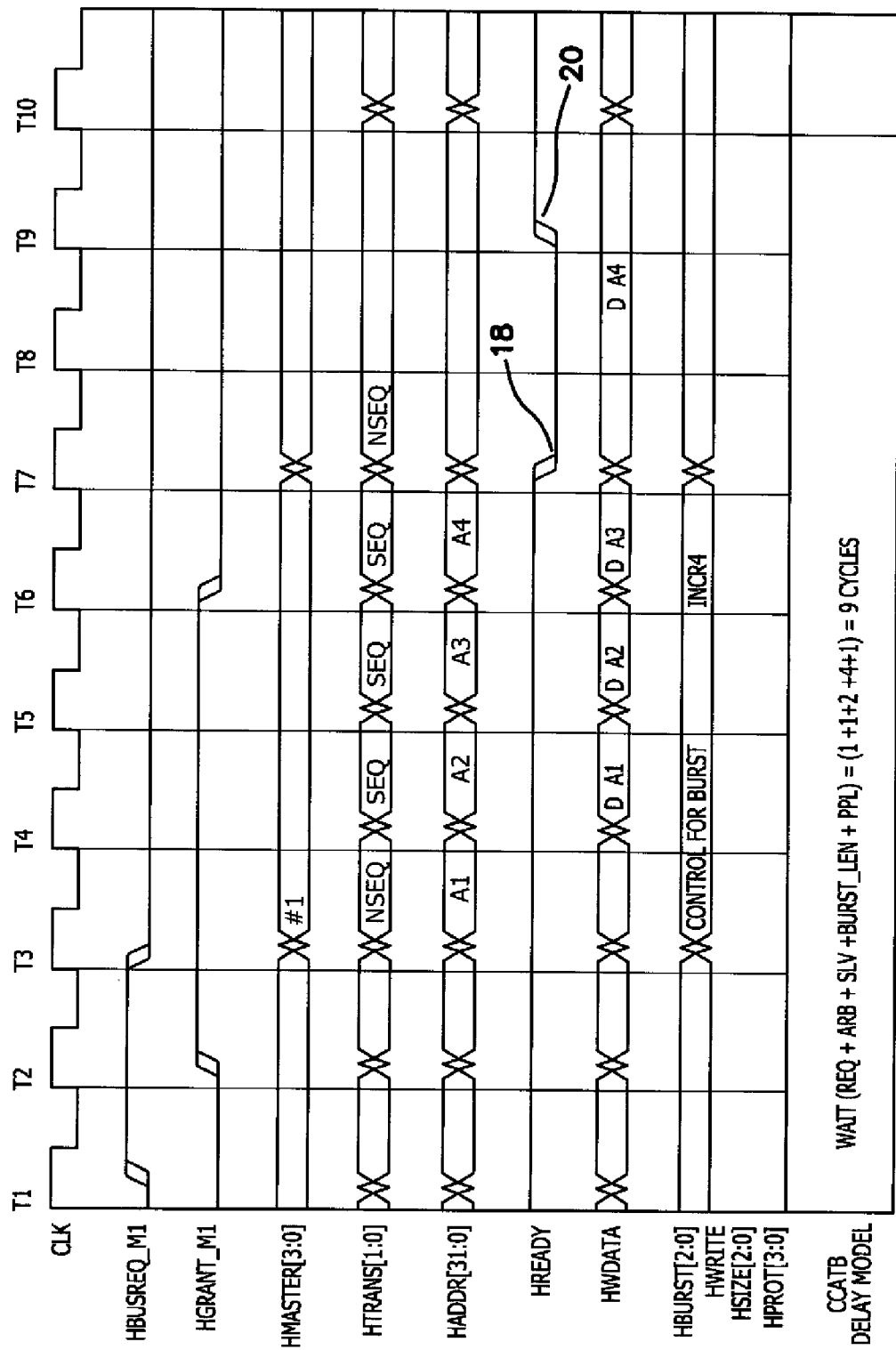
FIGS. 3a-3c are timing diagrams of three embodiments of an AMBA2 call sequence according to the invention.
Figure 3B:
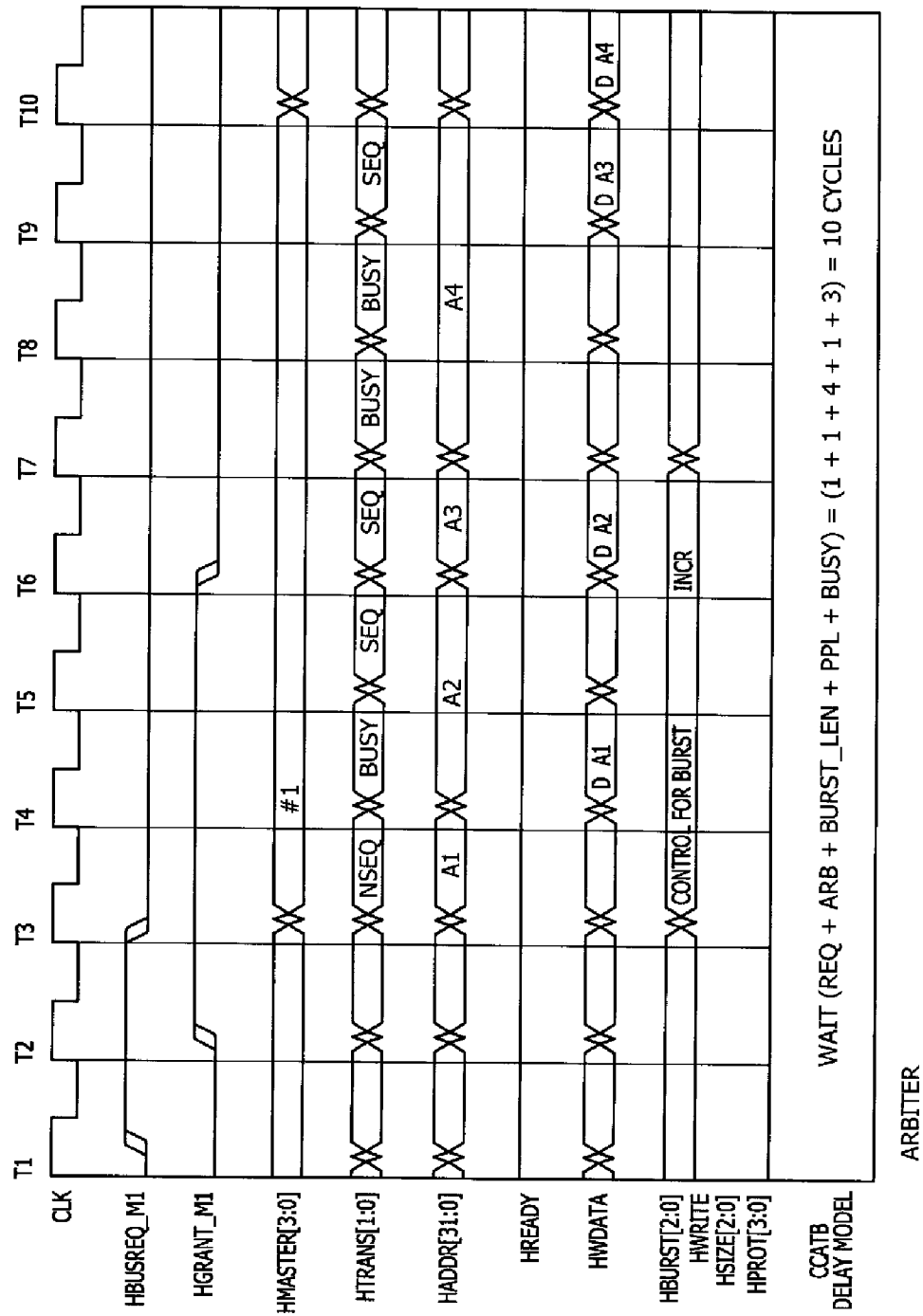
Figure 3C:
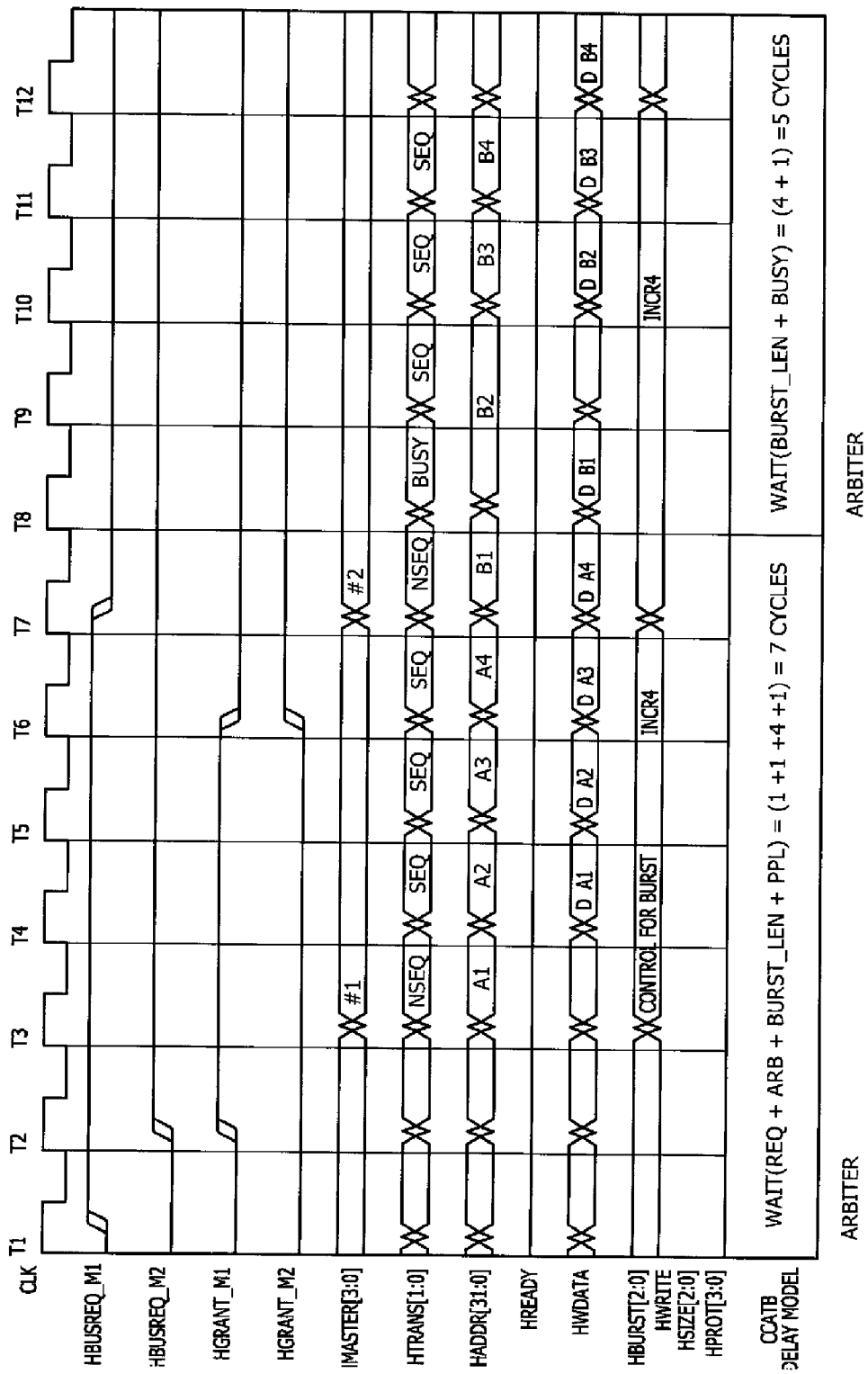
Figure 4:
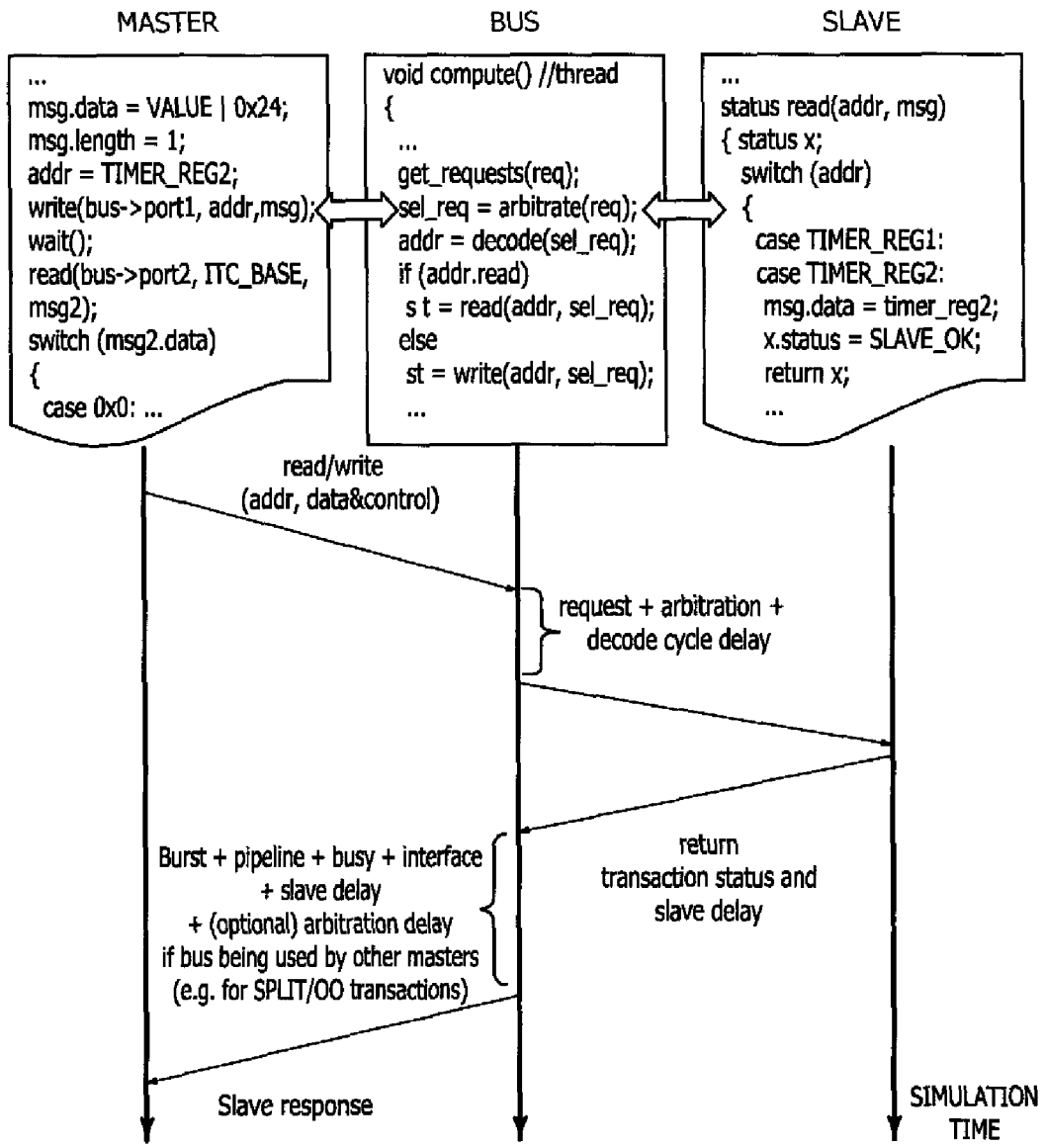
FIG. 4 is a flow diagram of a transaction execution sequence of the invention.

FIGS. 3a, 3b and 3c are timing diagrams that illustrate how the CCATB model maintains cycle count accuracy at transaction boundaries for different call sequences of the AMBA 2.0 protocol. In FIG. 3a a master 10 requests an incremental write burst of length four data packets and the arbiter 16 immediately grants it access to the bus 14. The transaction is initiated and data sent to the slave 12, but before it can process the final data packet in the sequence, the slave 12 needs to perform involved computation with the previously written data, which takes up two cycles. For this duration, the slave drives the HREADY signal low just at time 18 after T7 to indicate to the master that it is not ready yet to receive the final data packet in the burst. The burst transaction resumes once the slave 12 drives HREADY high at time 20 after T9. The sequence of actions in the CCATB model is shown in the symbolic flow diagram FIG. 4. The arbiter 16 accounts for the request (REQ) and arbitration (ARB) delays for the write request before invoking the slave 12 to complete the transaction. The slave 12 performs the write and returns a token structure which contains the status of the write and an indication to the arbiter 16 that need two wait states to be inserted. The arbiter 16 then increments simulation time with the slave delay (SLV), burst length (BURST_LEN) and pipeline startup (PPL) delays. The arbiter 16 then returns the status of the writes at the end of the transaction to the master 10.

The timing diagram of FIG. 3b illustrates a similar scenario, but this time there is delay in generating the data at the master end instead of a processing delay at the slave end. After the write burst initiates, the master 10 indicates that it requires extra cycles to generate write data for the slave 12 by sending a BUSY status on the HRESP[1:0] lines. In the CCATB model, the arbiter 16 gets a schedule of busy cycles from the master 10 when it receives the transaction request, and thus it accounts for the BUSY cycle delay in the transaction, along with the other delays discussed above. There is no delay at the slave 12 and consequently no increment in simulation time due to slave delay in this case.

In the timing diagram of FIG. 3c, after a master 10 requests access to the bus 14 for a write burst, another master 10a or 10b requests the bus 14 for a write burst. While there is no delay at the master or the slave end for the first write burst, there is delay in generating the data at the master end for master 10b, which is indicated by the BUSY status on the HRESP[1:0] lines. In the CCATB model, the arbiter 16 accounts for the REQ, ARB, BURST_LEN and PPL delays and increments simulation time. For the subsequent transaction by master 10b, the request has already been registered at the arbiter and no arbitration is required, so there is no REQ or ARB delay. Since transfers are pipelined, there is also no pipeline startup delay like in the case of master 10a. Thus there is no PPL delay. There is however delay which is dependent on the burst length (BURST_LEN) and the busy cycles (BUSY) which is accounted for by the arbiter 16. Like in the previous scenario, the slave 12 does not delay either of the burst transactions, so there is no simulation time increment due to slave delay.

Simulation Speedup Using CCATB

We now describe an implementation of the CCATB simulation model to explain how we obtain simulation speedup. We consider a design with several bus subsystems 22 within bus 14 each with its own separate arbiter and decoder 16, and connected to the other subsystems via bridges 34. The bus subsystem 22 supports pipelining, burst mode transfers and out-of-order (OO) transaction completion which are all features found in high performance bus architectures such as AMBA AXI. OO transaction completion allows slaves 12 to relinquish control of the bus 14, complete received transactions in any order and then request for re-arbitration so a response can be sent back to the master 10 for the completed transaction. OO latency period refers to the number of cycles that elapse after the slave 12 releases control of the bus 14 and before it requests for re-arbitration.

We begin with a few definitions. Each bus subsystem 22 is characterized by a tuple set X, where $X=\{R_{pend}, R_{act}, R_{oo}\}$. $R_{pend}$ is a set of read/write requests pending in the bus subsystem 22, waiting for selection by the arbiter 16. $R_{act}$ is a set of read/write requests actively executing in the subsystem 22. $R_{oo}$ is a set of out-of-order read/write requests in a subsystem 22 that are waiting to enter into the pending request set ($R_{pend}$) after the expiration of their OO latency period. Let A be a superset of the sets X for all p bus subsystems 22 in the entire system.

$$A = \bigcup_{i=1}^{p} X_i$$

Next we define τ to be a transaction request structure, which includes the following subfields:
wait_cyc specifies the number of wait cycles before the bus 14 can signal transaction completion to the master.
oo_cyc specifies the number of wait cycles before the request can apply for re-arbitration at the bus arbiter 16.
ooflag indicates if the request is an out-of-order transaction
status is defined to be a transaction response structure returned by the slave 12. It contains a field (stat) that indicates the status of the transaction (OK, ERROR etc.) as well as fields for the various delays encountered such as those for the slave interface (slave_int_delay), slave computation (slave_comp_delay) and bridges (bridge_delay).

Finally, let M be a set of all masters 10 in the system. Each master 10 is represented by a value in this set which corresponds to the sum of (i) the number of cycles before the next read/write request is issued by the master 10 and (ii) the master interface delay cycles. These values are maintained in a global table with an entry for each master 10 and do not need to be specified manually by a designer. A preprocessing stage can automatically insert directives in the code to update the table at the point when a master 10 issues a request to a bus 14.

Our approach speeds up simulation by preventing unnecessary invocation of simulation components and efficiently handling idle time during simulation. We now describe the implementation for our simulation model to show how this is accomplished.

| GatherRequests procedure |
|---|
| procedure GatherRequests( )<br>begin<br>    if request then<br>        τ ⇐ request<br>        τ.wait_cyc ⇐ 0<br>        τ.oo_cyc ⇐ 0<br>        τ.ooflag ⇐ FALSE<br>        $R_{pend} \Leftarrow R_{pend} \cup \tau$<br>end |

On a positive clock edge, master computation threads are triggered and possibly issue read/write transactions, which in turn trigger the GatherRequests procedure above in the bus module. GatherRequests simply adds the transaction request to the set of pending requests $R_{pend}$ for the subsystem.

| HandleBusRequests procedure |
|---|
| procedure HandleBusRequests( )<br>begin<br>    for each set X ∈ A do<br>        HandleCompletedRequests($R_{pend}$, $R_{act}$, $R_{oo}$)<br>        T ⇐ ArbitrateRequest($R_{pend}$, $R_{act}$)<br>        for each request τ ∈ T do<br>            if ( τ.ooflag == TRUE) then<br>                $R_{act} \Leftarrow R_{act} \cup \tau$<br>            else |

-continued

```
HandleBusRequests procedure status ⇐ issue( τ.port,τ.addr,τ )
        UpdateDelaysAndSets(status, τ, R_act, R_oo)
    ψ ⇐ DetermineIncrementPeriod(A)
    for each set X ∈ A do
        for each request τ ∈ R_oo do
            τ.oo_cyc ⇐ τ.oo_cyc - ψ
        for each request τ ∈ R_act do
            τ.wait_cyc ⇐ τ.wait_cyc - ψ
    for each value λ ∈ M do
        λ ⇐ λ - ψ
    simulation_time ⇐ simulation_time + ψ
end
```

On the negative clock edge, the HandleBusRequests procedure in the bus module is triggered to handle the communication requests in the system. This procedure calls the HandleCompletedRequests procedure set out below for every subsystem to check if any executing requests in $R_{act}$ have completed, in which case the master is notified and the transaction completed. HandleCompletedRequests also removes an out-of-order request from the set of out of order requests $R_{oo}$ and adds it to the pending request set $R_{pend}$ if it has completed waiting for its specified OO period.

```
HandleCompletedRequests procedure procedure HandleCompletedRequests(R_pend, R_act, R_oo)
begin
    S_pend ⇐ null ; S_act ⇐ null ; S_oo ⇐ null ;
    for each request τ ∈ R_act do
        if ( τ.wait_cyc == 0 ) then
            notify( τ.master, τ.status)
        else
            S_act ⇐ S_act ∪ τ
    for each request τ ∈ R_oo do
        if ( τ.oo_cyc == 0 ) then
            S_pend ⇐ S_pend ∪ τ
        else
            S_oo ⇐ S_oo ∪ τ
    R_pend ⇐ S_pend ; R_act ⇐ S_act ; R_oo ⇐ S_oo ;
end
```

ArbitrateRequest function

```
function ArbitrateRequest(R_pend, R_act)
begin
    T ⇐ null
    for each independent channel c ∈ subsystem R_pend do
        T ⇐ T □ ArbitrateOnPolicy(c, R_pend)
    R_pend ⇐ R_pend \ T
    return T
end
```

Next, we arbitrate to select requests from the pending request set $R_{pend}$ which will be granted access to the bus. The function ArbitrateRequest above performs the selection based on the arbitration policy selected for every bus 14. We assume that a call to the ArbitrateOnPolicy function applies the appropriate arbitration policy and returns the selected requests for the bus 14. After the selection we update the set of pending requests $R_{pend}$ by removing the requests selected for execution (and hence not 'pending' anymore). Since a bus subsystem 22 can have independent read and write channels, there can be more than one active request executing in the subsystem 22, which is why ArbitrateRequest returns a set of requests and not just a single request for every subsystem.

After the call to ArbitrateRequest, if the ooflag field of the selected request is TRUE, it implies that this request has already been issued to the slave and now needs to wait for τ.wait_cyc cycles before returning a response to the master 10. Therefore we simply add it to the executing requests set $R_{act}$. Otherwise we issue the request to the slave 12 which completes the transaction in zero-time and returns a status to the bus module. We use the returned status structure to update the transaction status by calling the UpdateDelaysAndSets procedure.

```
UpdateDelaysAndSets procedure procedure UpdateDelaysAndSets( status, τ, R_act, R_oo)
begin
    if (status.stat == OK) then
        τ.status = OK
        if (status.oo == TRUE) then
            τ.ooflag ⇐ TRUE
            τ.oo_cyc ⇐ status.(oo_delay + slave_int_delay
                            + slave_comp_delay + bridge_delay)
                            + τ.arb_delay
            τ.wait_cyc ⇐ τ.(busy_delay + burst_length_delay
                            + ppl_delay + bridge_delay + arb_delay)
            R_oo ⇐ R_oo ∪ τ
        else
            τ.wait_cyc ⇐ status.(slave_int_delay
                            + slave_comp_delay + bridge_delay)
                            + τ.(busy_delay + burst_length_delay
                            + ppl_delay + arb_delay)
            R_act ⇐ R_act ∪ τ
    else
        τ.status = ERROR
        τ.wait_cyc ⇐ status.(slave_int delay
                            + bridge_delay + error_delay)
                            + τ.(busy_delay + burst_length_delay
                            + ppl_delay + arb_delay)
end
```

In this procedure we first check for the returned error status. If there is no error, then depending on whether the request is an out-of-order type or not, we update τ.oo_cyc with the number of cycles to wait before applying for re-arbitration, and τ.wait_cyc with the number of cycles before returning a response to the master. We also update the set $R_{act}$ with the actively executing requests and $R_{oo}$ with the OO requests. If an error occurs, then the actual slave computation delay can differ and is given by the field error_delay. The values for other delays such as burst length and busy cycle delays are also adjusted to reflect the truncation of the request due to the error.

```
DetermineIncrementPeriod function function DetermineIncrementPeriod(A)
begin
    ψ ⇐ inf
    for each set X ∈ A do
        for each set R_pend ∈ X do
            if R_pend ≠ NULL then
                ψ ⇐ 1
                return ψ
        for each set R_act ∈ X do
            for each request τ' ∈ R_act do
                ψ ⇐ min { ψ, τ'.wait_cyc }
        for each set R_oo ∈ X do
            for each request τ'' ∈ R_oo do
                ψ ⇐ min { ψ, τ''.oo_cyc }
```

```
                    -continued
─────────────────────────────────────────────
             DetermineIncrementPeriod function for each value λ ∈ M do
               ψ ⇐ min { ψ, λ }
        return ψ
        end
─────────────────────────────────────────────
```

After returning from the UpdateDelaysAndSets procedure, we find the minimum number of cycles (ψ) before we need to invoke the HandleBusRequests procedure again, by calling the DetermineIncrementPeriod function. This function returns the minimum value out of the wait cycles for every executing request (τ.wait_cyc), out-of-order request cycles for all waiting OO requests (τ.oo_cyc) and the next request latency cycles for every master (λ). If there is a pending request which needs to be serviced in the next cycle, the function returns 1, which is the worst case return value. By default, the HandleBusRequests procedure is invoked at the negative edge of every simulation cycle, but if we find a value of ψ which is greater than 1, we can safely increment system simulation time by that value, preventing unnecessary invocation of procedures and thus speeding up simulation.

It should be noted that for some very high performance designs it is possible that there is very little scope for this kind of speedup. Although this might appear to be a limitation, there is still substantial speedup achieved over BCA models because we handle all the delays in a transaction in one place, namely in the bus module, without repeatedly invoking other parts of the system on every cycle (master and slave threads and processes) which would otherwise contribute to simulation overhead.

Modeling Methodology

Figure 5:
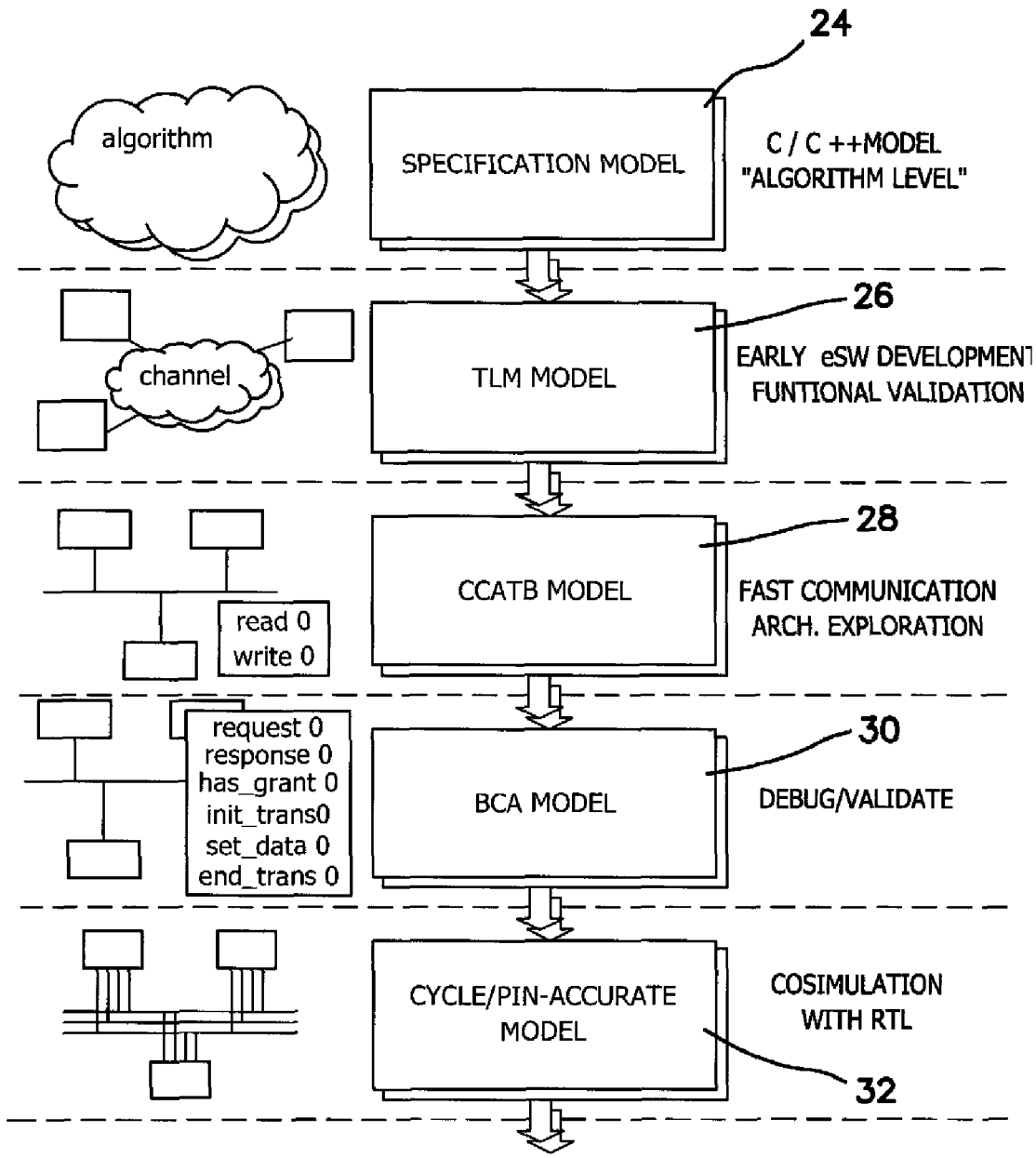
FIG. 5 is a diagrammatic flow chart of the system design methodology of the invention.

We define a modeling methodology which integrates our CCATB model in a high level system modeling flow. FIG. 5 is a block flow diagram which symbolically depicts our proposed flow which has five system models at different abstraction levels. At the topmost step 24 is a specification model which is a high level algorithmic implementation of the functionality of the system. This model is generally captured in C or C++ and is independent of the hardware architecture that would eventually be used to implement the algorithm. After selecting available hardware components and partitioning functionality between hardware and software, we arrive at the step 26 of TLM model ported to SystemC. At this step 26, high level functional blocks representing hardware components such as CPUs, memories and peripherals are connected together using a bus architecture-independent generic channel. This system model is used for early embedded software development and high-level platform validation. It is generally untimed but the model can be annotated with timing information if a high level estimate of system performance is required. Once the bus architecture is decided, the channel is annotated with timing and protocol details and the interface is refined to obtain the CCATB model at step 28. This model is used for fast communication space and system performance exploration. The read( ), write( ) channel interface from the TLM level remains the same as explained earlier except that now bus-architecture specific control information also needs to be passed. Components from the TLM step 26 can be easily and quickly refined to add this detail. To obtain observable cycle accuracy for system debugging and validation, the read( ) and write( ) interface calls are decomposed into several method calls which correspond to bus pins in the BCA step 30. This is a cycle accurate model, but since method calls are used instead of pins (represented by signals in SystemC), simulation is faster. Finally these method calls can be replaced by signals and the components refined further to obtain pin/cycle-accurate models at step 32 which can be manually or automatically mapped to RTL, or simply be used to co-simulate with existing RTL components for better simulation performance while validating system design at a low level.

Exploration Embodiments

To demonstrate the effectiveness of exploration with CCATB, we present two embodiments where we used CCATB models to explore the communication design space of the system. In the first embodiment we compare and configure bus architectures for a SoC subsystem used in the broadband communication domain. In the second embodiment, we assume that the choice of bus architecture has already been made and we explore different configurations of the bus architecture for a multimedia SoC subsystem.

Broadband Communication SoC

Figure 6:
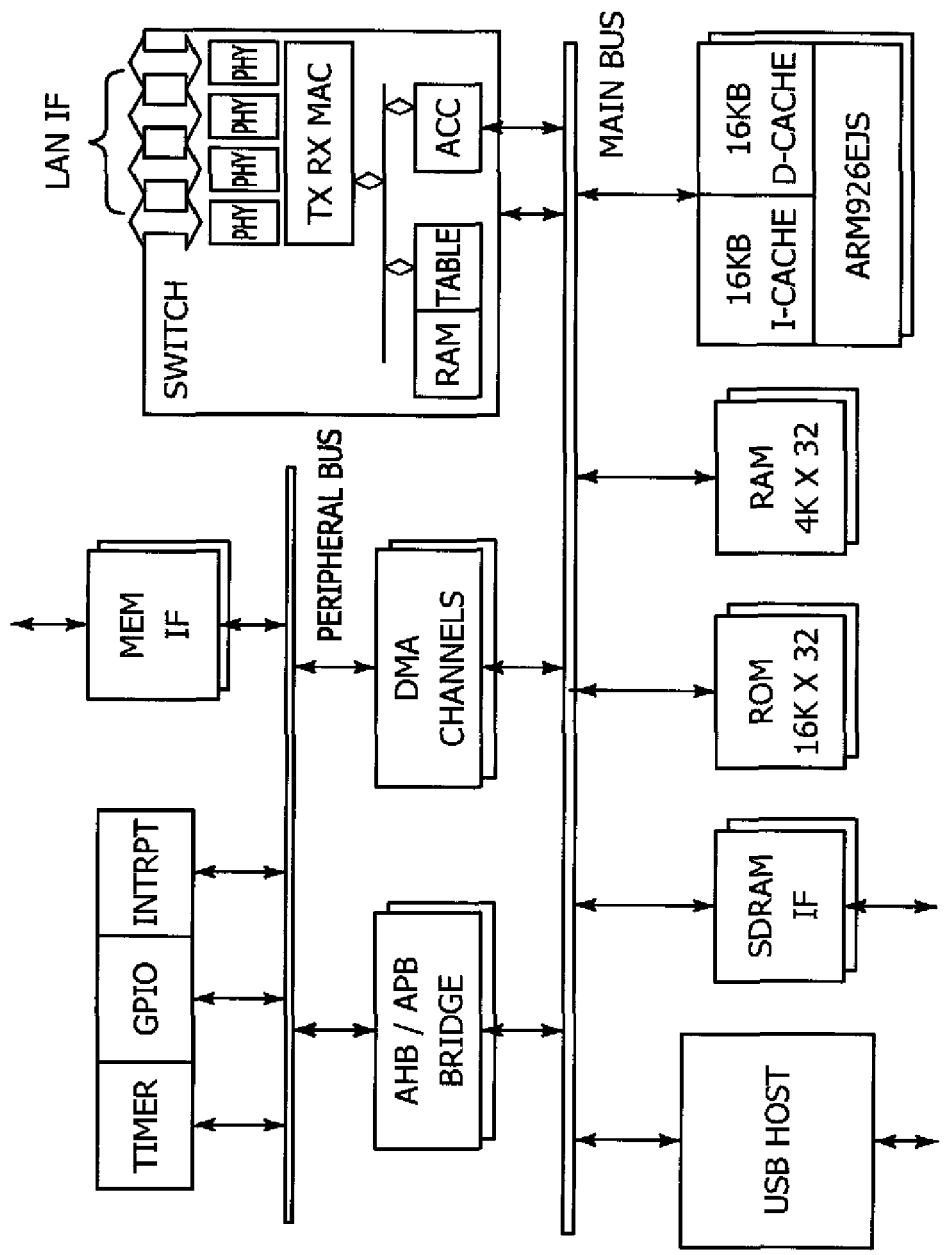
FIG. 6 is a schematic diagram of a broadband communication SoC platform in which the present invention is implemented as first illustrative embodiment.

In this embodiment we modeled an actual industrial strength SoC platform and performed several communication space exploration experiments on it. We present four of these in this section. All of these experiments were reproduced and verified at the more refined PA-BCA level. FIG. 6 is a schematic block diagram which shows this SoC platform which has applications in the broadband communication domain. We execute three proprietary benchmarks (COMPLY, USBDRV and SWITRN) on the ARM926 processor instruction-set simulator (ISS), each of which activate different modes of operation for the platform. COMPLY configures the universal serial bus (USB), switch and DMA modules to drive traffic on the shared bus. USBDRV also configures the USB and DMA to drive traffic normally on the bus 14 but the switch activity is restricted. SWITRN configures the switch to drive traffic on the bus normally but restricts USB and DMA activity.

Figure 7:
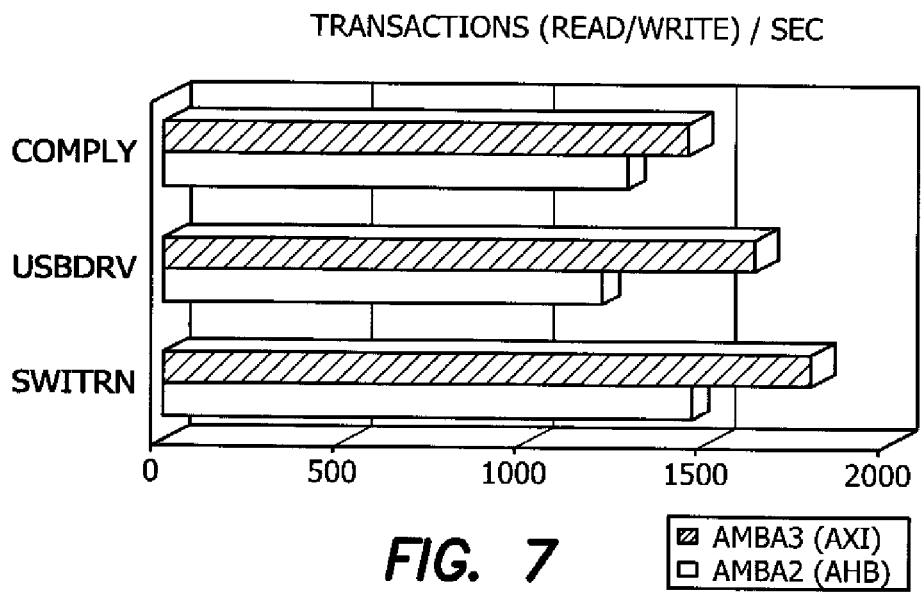
FIG. 7 is a bar chart showing a bus protocol comparison of the system of FIG. 6 when the communication protocol is simulated with AMBA2 AHB system bus and then the AMBA3 AXI system bus.

In our first experiment, we attempted to observe the effect of changing communication protocol on overall system performance. We first simulated the platform with the AMBA2 AHB system bus and then replaced it with the AMBA3 AXI bus protocol, keeping the same driver application in both cases and without changing any bus parameters such as arbitration strategy. FIG. 7 is a bar chart which shows that the AXI protocol improves overall system throughput compared to AHB. This is because in AMBA 2.0, the address bus is occupied mostly by transmission of addresses of transactions within a burst. In contrast, only the first address of a burst is transmitted in AMBA 3.0 AXI, which coupled with transaction reordering allows improved simultaneous read/write transaction execution and better throughput. Our model allows rapid plug-and-play exploration of different bus architectures, requiring changes in just a few lines of code to declare and instantiate the bus in the top-level file.

Figure 8:
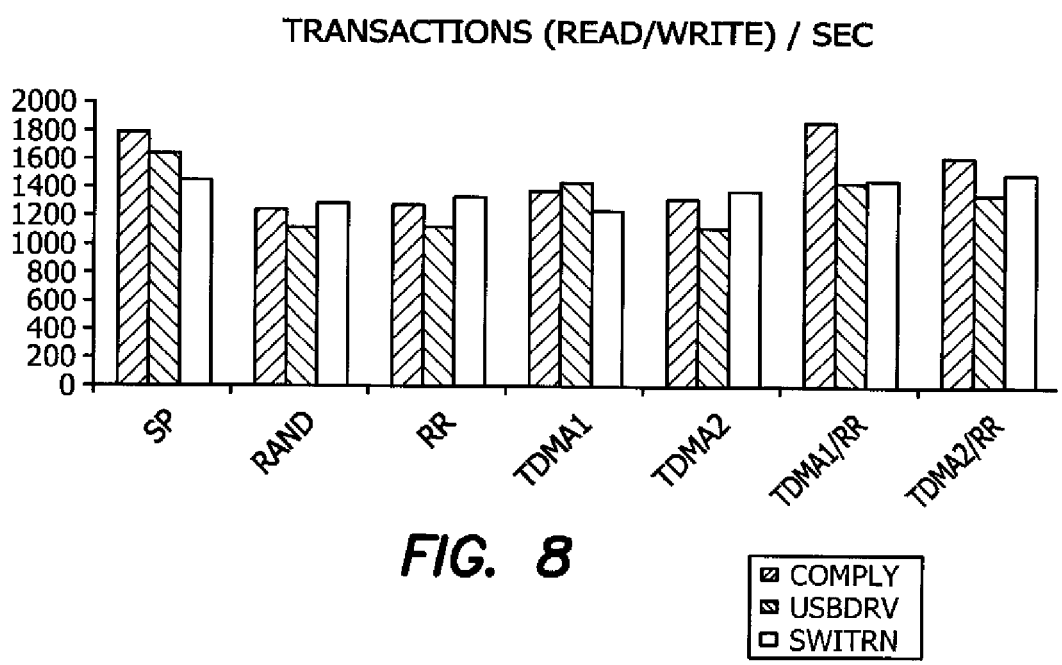
FIG. 8 is a bar chart showing a comparison of bus throughput of the system of FIG. 6 for three benchmarks.

Next, we explore the effect of arbitration strategies on system performance. We used the AMBA2 AHB system bus and tested the following arbitration strategies, namely static priority (SP), random priority (RP), round robin (RR), time division multiple access (TDMA) with 2 slots for the USB host and 1 for the rest (TDMA1), TDMA with 2 slots for the switch subsystem and 1 for the rest (TDMA2), TDMA1 with RR (TDMA1/RR) and TDMA2 with RR (TDMA2/RR), where the RR strategy is applied only if the selected master has no transaction to issue. FIG. 8 is a bar chart which shows the bus throughput for the three benchmarks. It can be seen that TDMA1/RR outperforms other schemes for COMPLY, while static priority works best for USBDRV (with the USB host given the maximum priority) and SWITRN (where the switch subsystem is given the maximum priority). We measure overall bus throughput. However if bandwidth constraints for certain masters need to be met and overall throughput is a less important criteria, then other strategies might give better results. Also, more involved strategies such as a dynamic priority scheme can be easily introduced into this framework if traffic based adaptable behavior is preferred.

Figure 9:
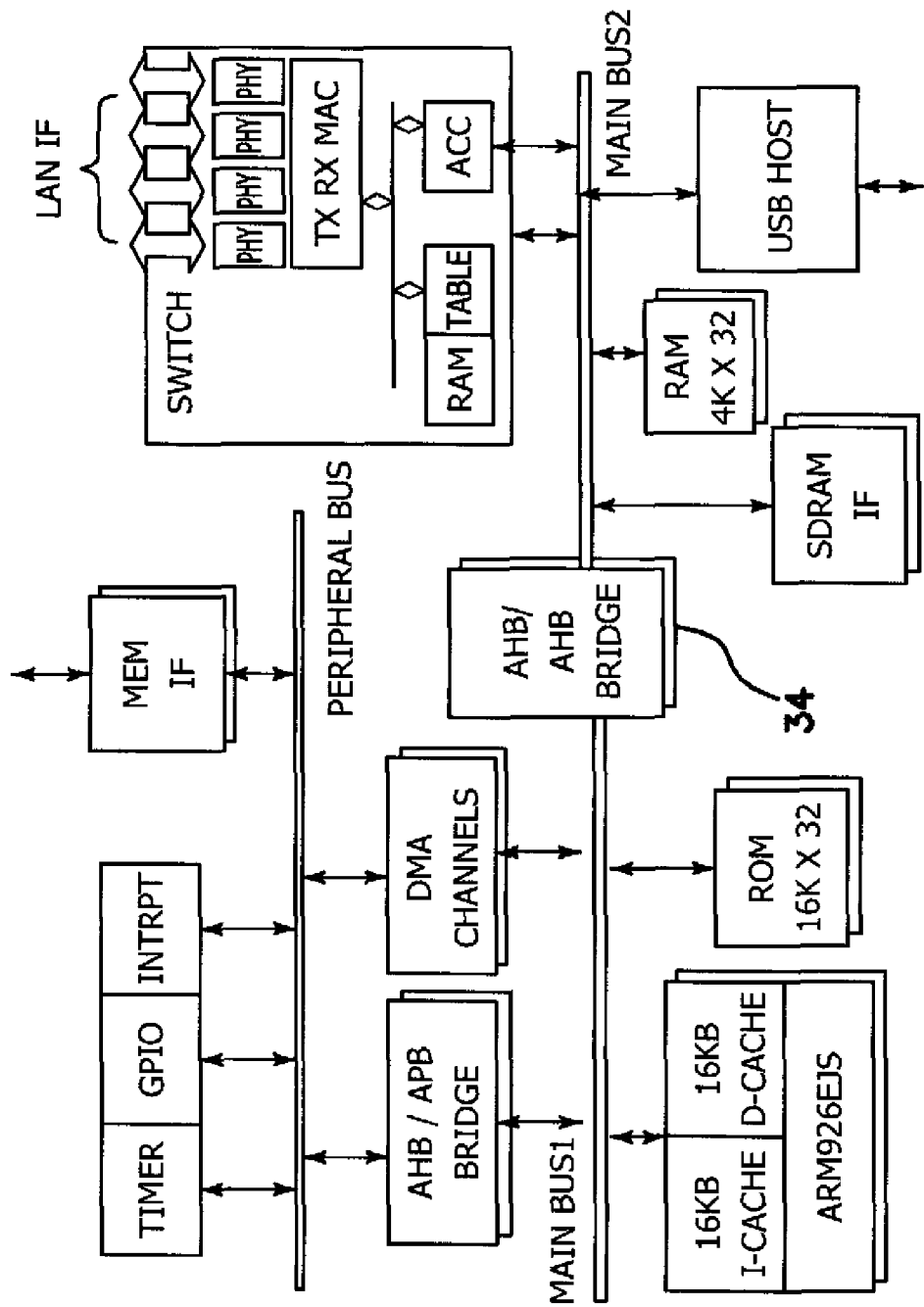
FIG. 9 is a schematic diagram of the system of FIG. 6 in a first bus decomposition of a shared bus.
Figure 10:
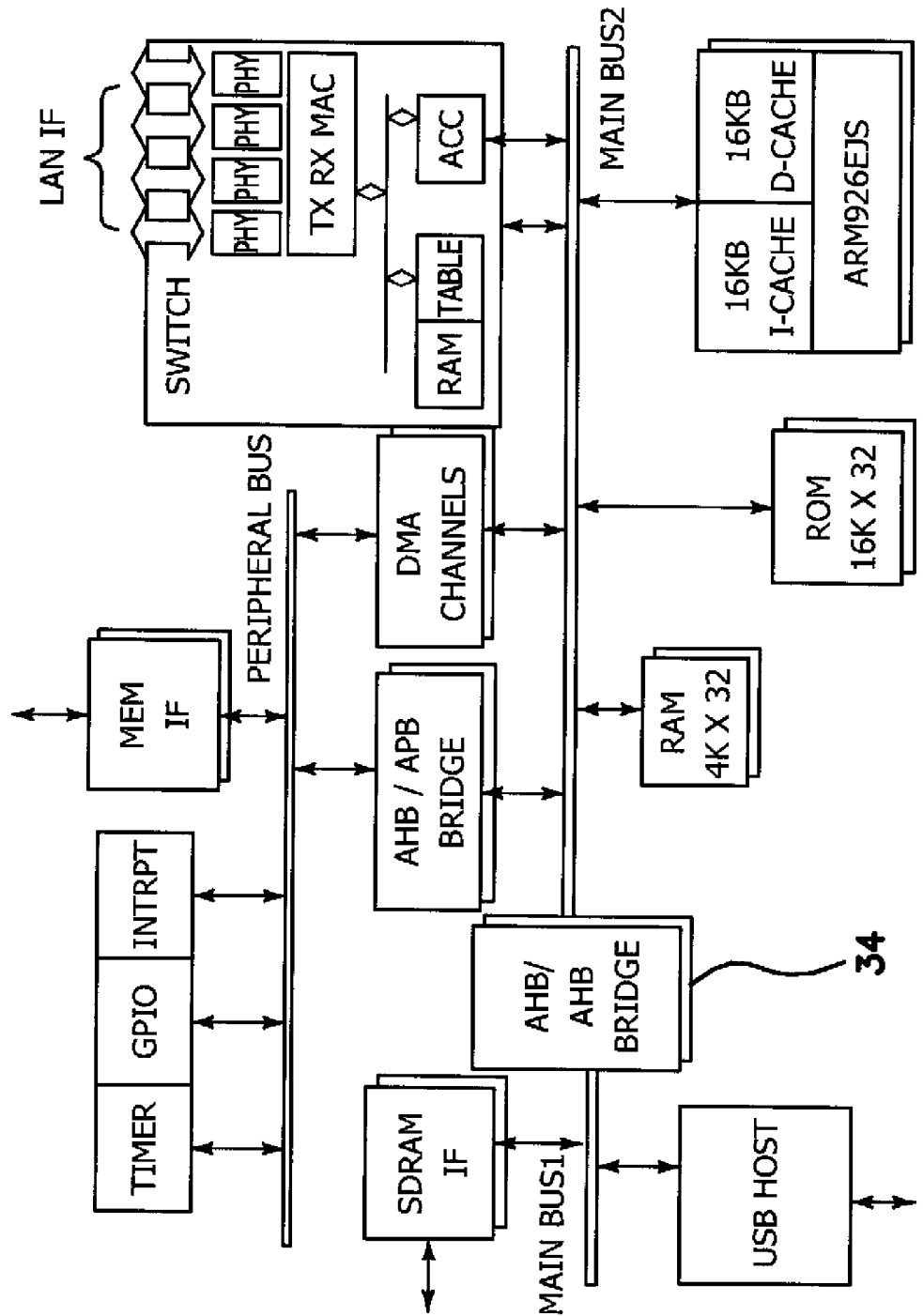
FIG. 10 is a schematic diagram of the system of FIG. 6 in a second bus decomposition of a shared bus.
Figure 11:
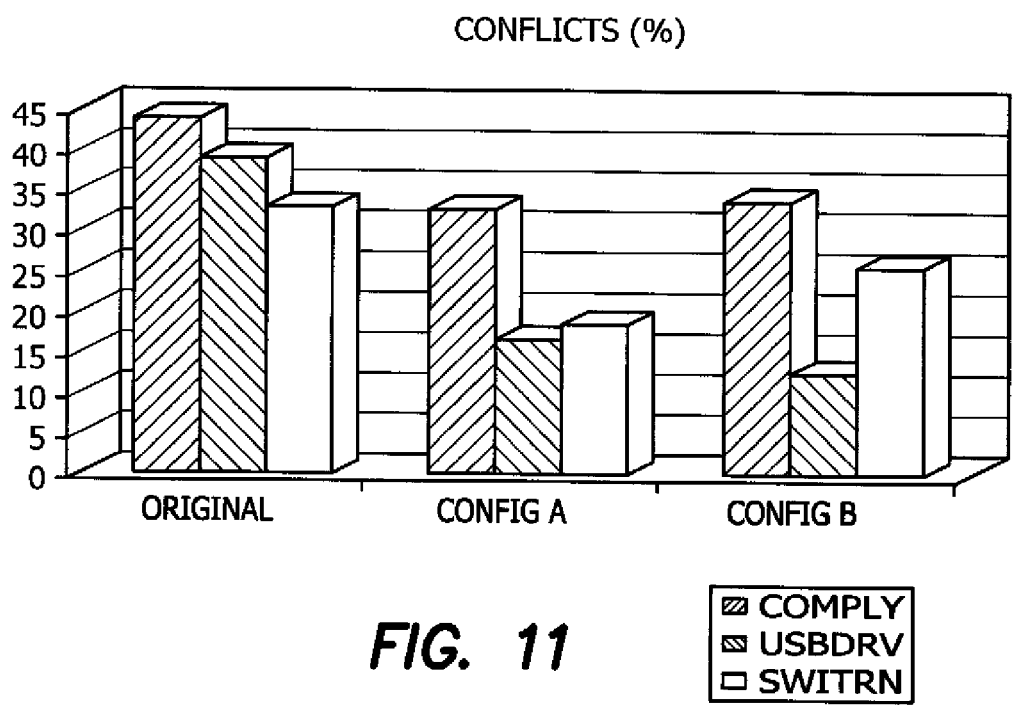
FIG. 11 is a bar chart of the bus conflicts for the bus topologies of FIGS. 6, 9 and 10 in the three benchmarks of FIG. 8.

To ascertain the influence of bus hierarchy on improving system performance by eliminating conflicts on a shared bus, we decomposed the shared bus into two hierarchical busses in our next experiment. First in configuration A shown in the block diagram of FIG. 9 we kept the ARM CPU and DMA master on one bus and the switch subsystem and USB host master on the other. In configuration B shown in the block diagram of FIG. 10 we kept the ARM CPU, DMA and the switch subsystem on one bus while the USB host was given a dedicated bus. We used the TDMA1/RR strategy for conflict resolution. The bar chart of FIG. 11 shows bus conflicts for these cases. It can be seen that configuration A has the least conflicts for COMPLY and SWITRN. This is because configuration A avoids conflicts between the DMA and the switch module which is the main source of conflict in SWITRN and one of the main ones in COMPLY (along with the USB-switch conflict). Configuration B is the best for USBDRV since conflicts between the USB (which drives the maximum traffic) and the DMA (which also drives a lot of traffic) are reduced when the USB is given a dedicated bus.

Figure 12:
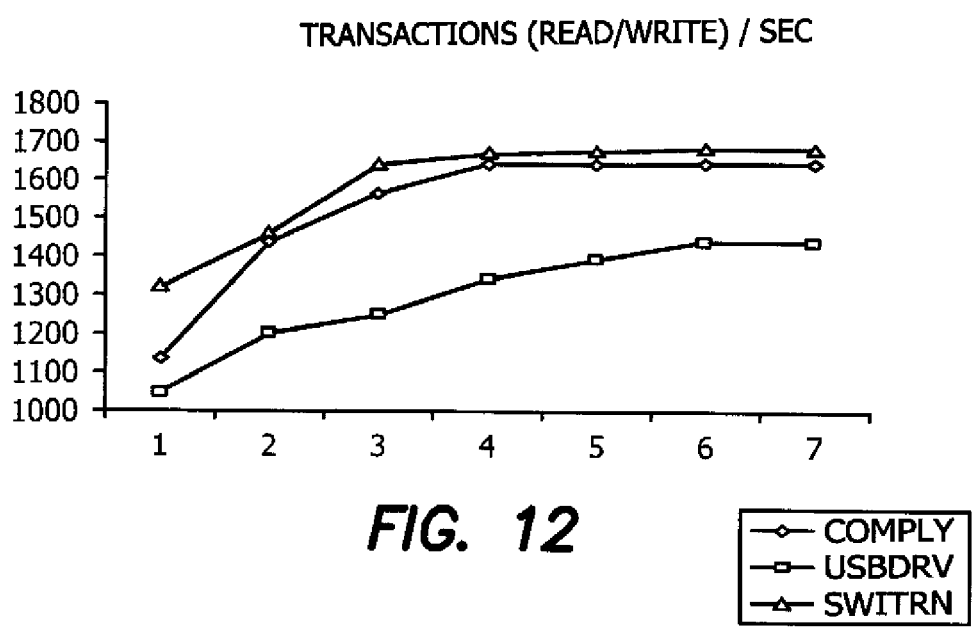
FIG. 12 is a graph showing the change in transactions per second as a function of SDRAM OO queue size for the three benchmarks.

Finally, we study the effect of changing outstanding request queue size for the SDRAM IF module which supports out-of-order execution of read/write requests as specified by the AMBA3 AXI protocol. FIG. 12 is a graph of transaction rates as a function of queue size and shows the effect of change in performance when the queue size is changed. It can be seen that performance saturates and no more gain can be obtained after the queue size has been increased to 4 for COMPLY, and 6 for SWITRN and USBDRV. This is a limit on the number of simultaneous requests issued at any given time for the SDRAM IF by the masters in the system for these benchmarks. It can be seen that this parameter is highly application dependent and changes with changing application requirements, demonstrating the need for this type of an exploration environment.

Multimedia Soc Subsystem

Figure 13:
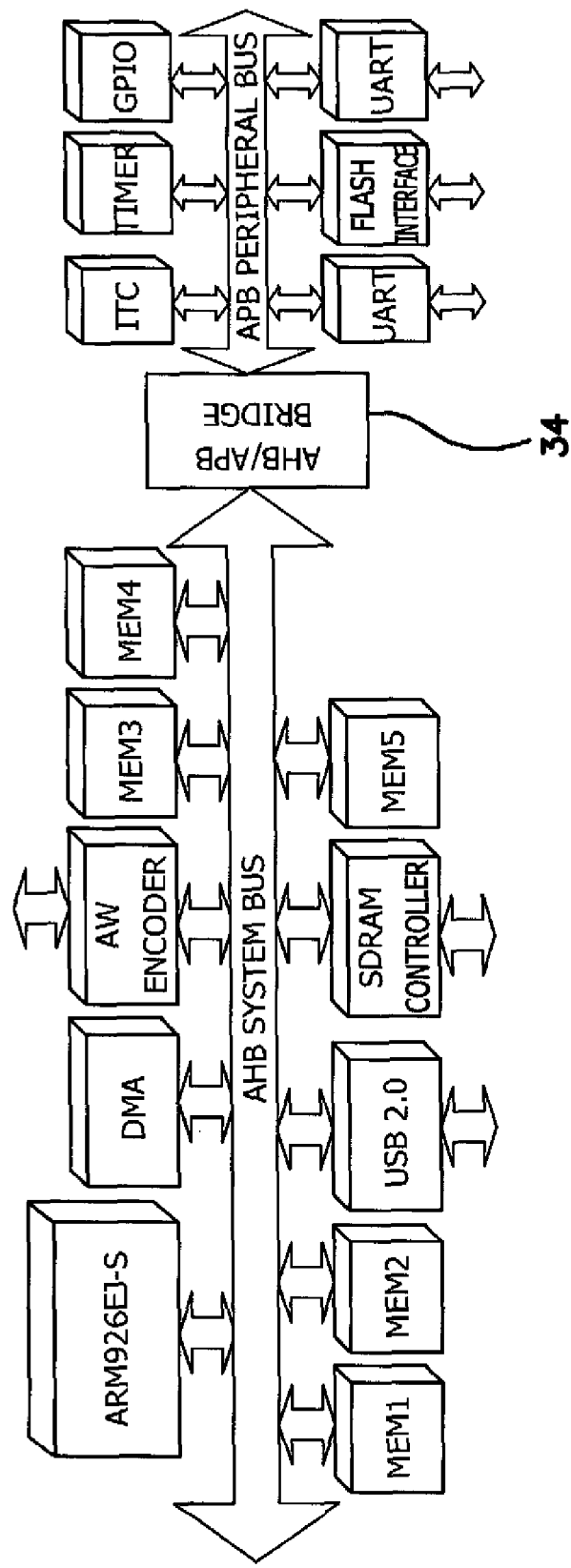
FIG. 13 is a schematic block diagram of a SoC multimedia system in which the present invention is implemented as second illustrative embodiment.

For the second illustrative embodiment, we explore a consumer multimedia SoC subsystem which performs audio and video encoding for popular codecs such as MPEG. FIG. 13 is a schematic block diagram which shows this platform, which is built around the AMBA 2.0 communication architecture, with a high performance bus (AHB or Advanced high performance bus) and a peripheral bus (APB or Advanced peripheral bus) for high latency, low bandwidth peripheral devices. The system has an ARM926EJ-S processor with embedded software running on it to supervise flow control and perform encryption, a fast USB interface, on-chip memory modules, a DMA controller, an SDRAM controller to interface with external memory components and standard peripherals such as a timer, UART, interrupt controller, general purpose I/O and a Compact Flash card interface.

Figure 14A:
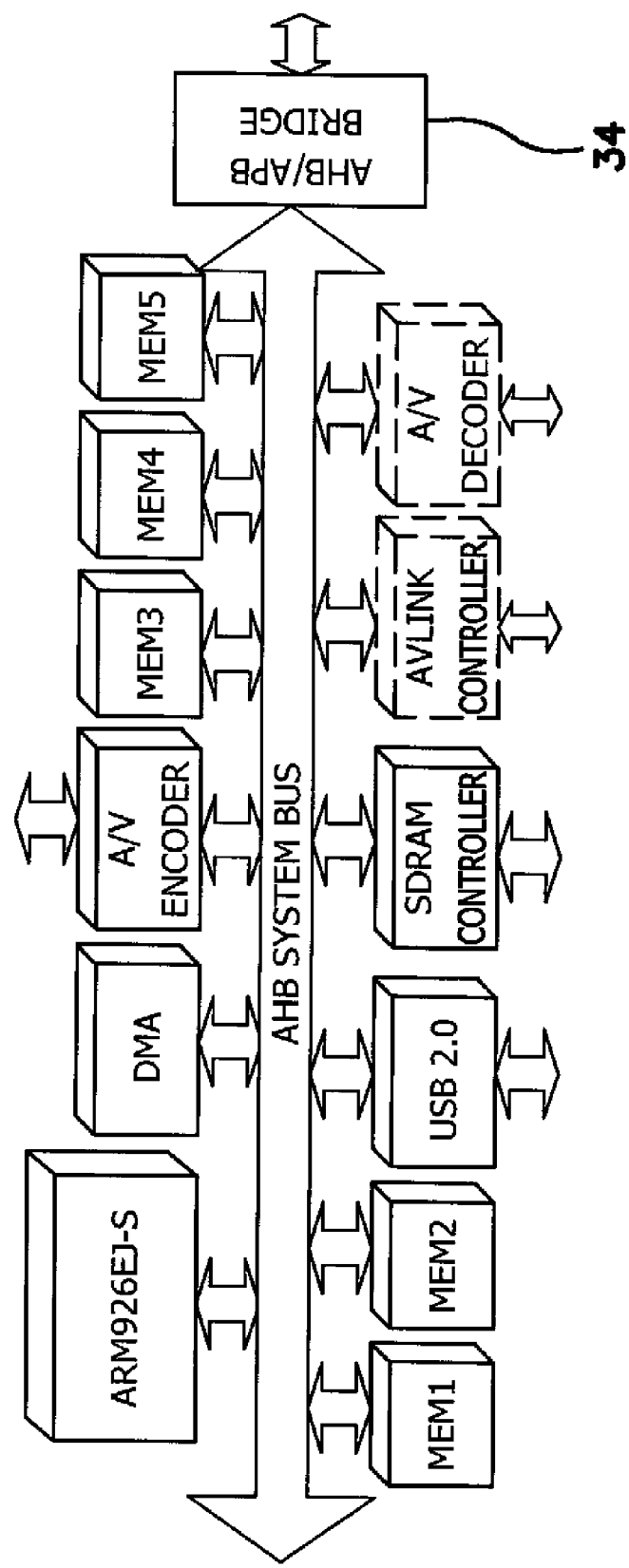
FIGS. 14a-14c are four architectures of the system of FIG. 13 simulated with different arbitration schemes.

Consider a scenario where the designer wishes to extend the functionality of the encoder system to add support for audio/video decoding and an additional AVLink interface for streaming data. The final architecture must also meet peak bandwidth constraints for the USB component (480 Mbps) and the AVLink controller interface (768 Mbps). FIG. 14*a* is a schematic block diagram which shows the system with the additional components added to the AHB bus. To explore the effects of changing communication architecture topology and arbitration protocols on system performance, we modeled the SoC platform at the CCATB level and simulated a test program for several interesting combinations of topology and arbitration strategies. For each configuration, we determined if bandwidth constraints were being met and iteratively modified the architecture till all the constraints were satisfied.

TABLE 2

| Architecture | Arbitration Scheme | | | | |
| --- | --- | --- | --- | --- | --- |
| | RR | TDMA1 | TDMA2 | SP1 | SP2 |
| Arch1 | 27.24 | 24.65 | 25.06 | 25.72 | 26.49 |
| Arch2 | 24.98 | 23.86 | 23.03 | 23.52 | 23.44 |
| Arch3 | 24.73 | 23.74 | 22.96 | 23.11 | 23.05 |
| Arch4 | 22.02 | 21.79 | 21.65 | 21.18 | 21.26 |

Table 2 shows the system performance (total cycle count for test program execution) for some of the architectures we considered, shown in FIGS. 14*a*, 14*b*, 14*c* and 14*d*. In the columns for arbitration strategies, RR stands for a round robin scheme where bus bandwidth is equally+ distributed among all the masters. TDMA1 refers to a TDMA strategy where in every frame 4 slots are allotted to the AVLink controller, 2 slots to the USB, and 1 slot for the remaining masters. In TDMA2, 2 slots are allotted to the AVLink and USB, and 1 slot for the remaining masters. In both the TDMA schemes, if a slot is not used by a master then a secondary RR scheme is used to grant the slot to a master with a pending request. SP1 is a static priority scheme with the AVLink controller having a maximum priority followed by the USB, ARM926, DMA, AN Encoder and the A/V Decoder. The priorities for the AVLink controller and USB are interchanged in SP2, with the other priorities remaining the same as in SP1.

For architecture Arch1, of FIG. 14*a* performance suffers due to frequent arbitration conflicts in the shared AHB bus. The shaded cells indicate scenarios where the bandwidth constraints for the USB and/or AVLink controller are not met. From Table 2 we can see that none of the arbitration policies in Arch1 satisfy the constraints.

Figure 14B:
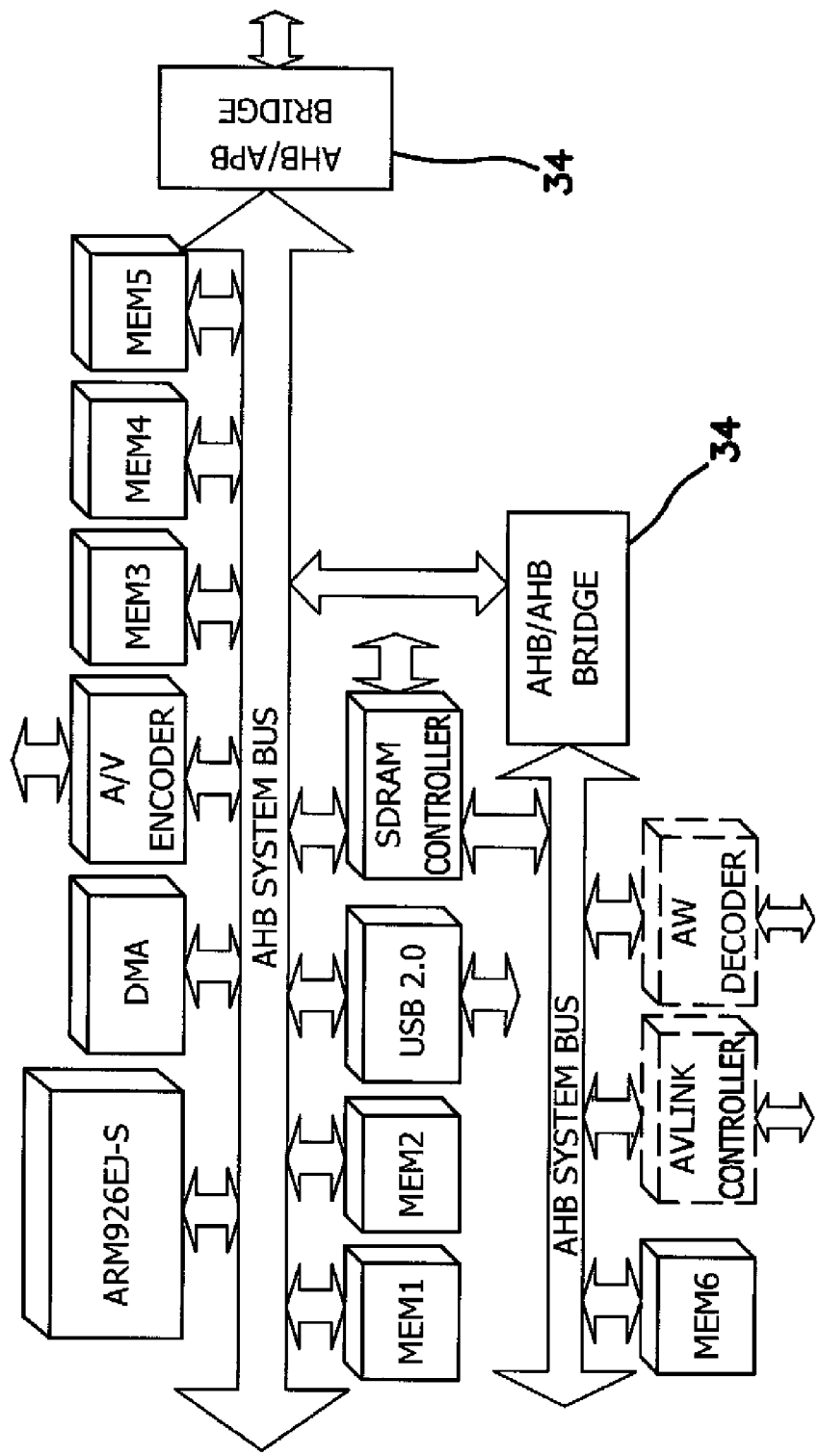

To decrease arbitration conflicts, we shift the new components to a dedicated AHB bus as shown in FIG. 14*b*. An AHB/AHB bridge is used to interface with the main bus. We split MEM5 and attach one of the memories (MEM6) to the dedicated bus and also add an interface to the SDRAM controller ports from the new bus, so that data traffic from the new components does not load the main bus as frequently. Table 2 shows a performance improvement for Arch2 in FIG. 14*b* as arbitration conflicts are reduced. With the exception of the RR scheme, bandwidth constraints are met with all the other arbitration policies. The TDMA2 scheme outperforms TDMA1 because of the reduced load on the main bus from the AVLink component which results in inefficient RR distribution of its 4 slots in TDMA1. TDMA2 also outperforms the SP schemes because SP schemes result in much more arbitration delay for the low priority masters (ARM CPU, DMA), whereas TDMA2 guarantees certain bandwidth even to these low priority masters in every frame.

Figure 14C:
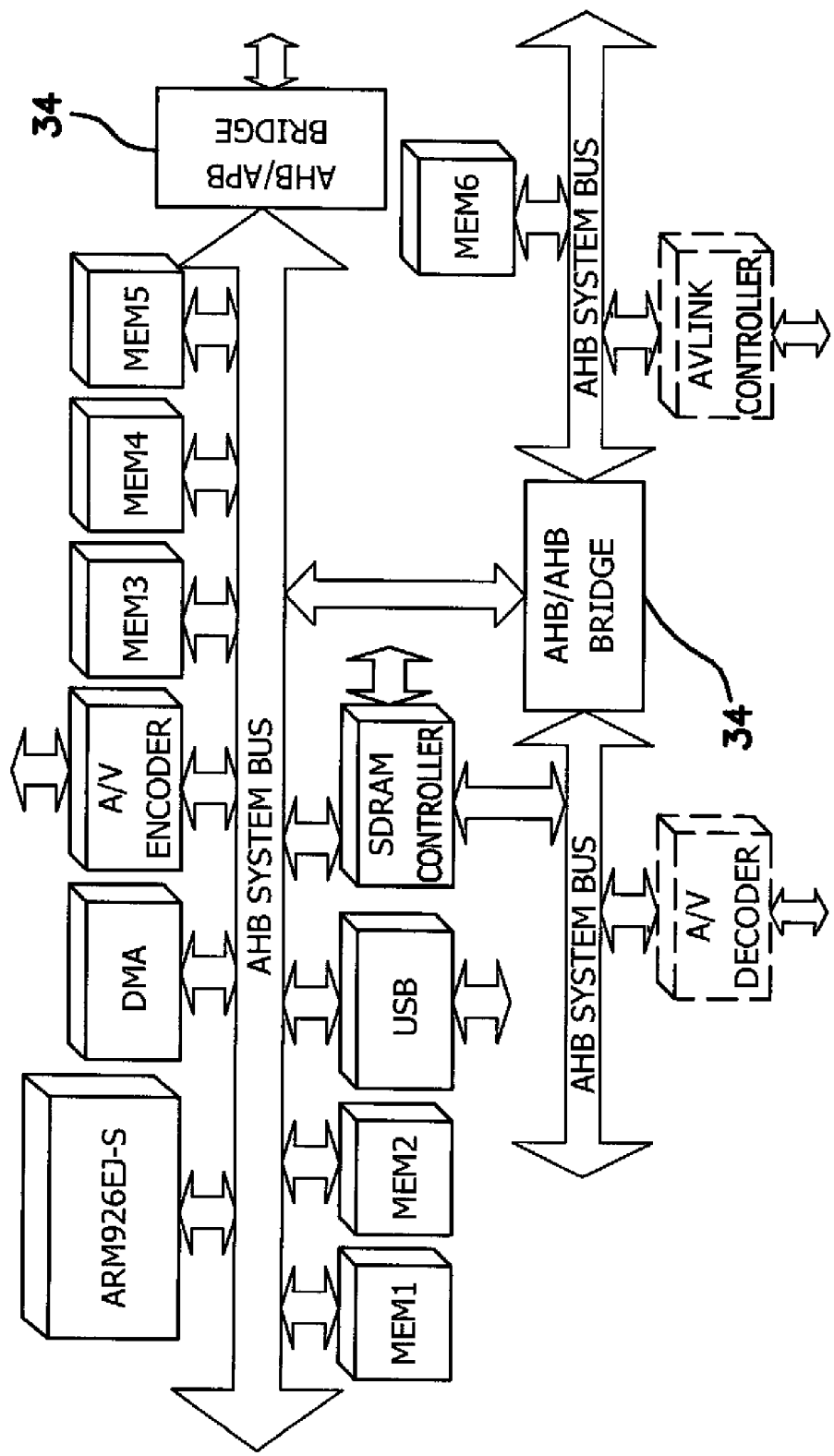

Next, to improve performance we allocate the A/V Decoder and AVLink components to separate AHB busses, as shown in FIG. 14*c*. From Table 1 we see that the performance for Arch3 improves only slightly over Arch2. The reason for the small improvement in performance is because there is not a lot of conflict (or time overlap) between transactions issued by the A/V decoder and AVLink components. As such, separating these components eliminates those few conflicts that exist between them, improving performance only slightly.

Figure 14D:
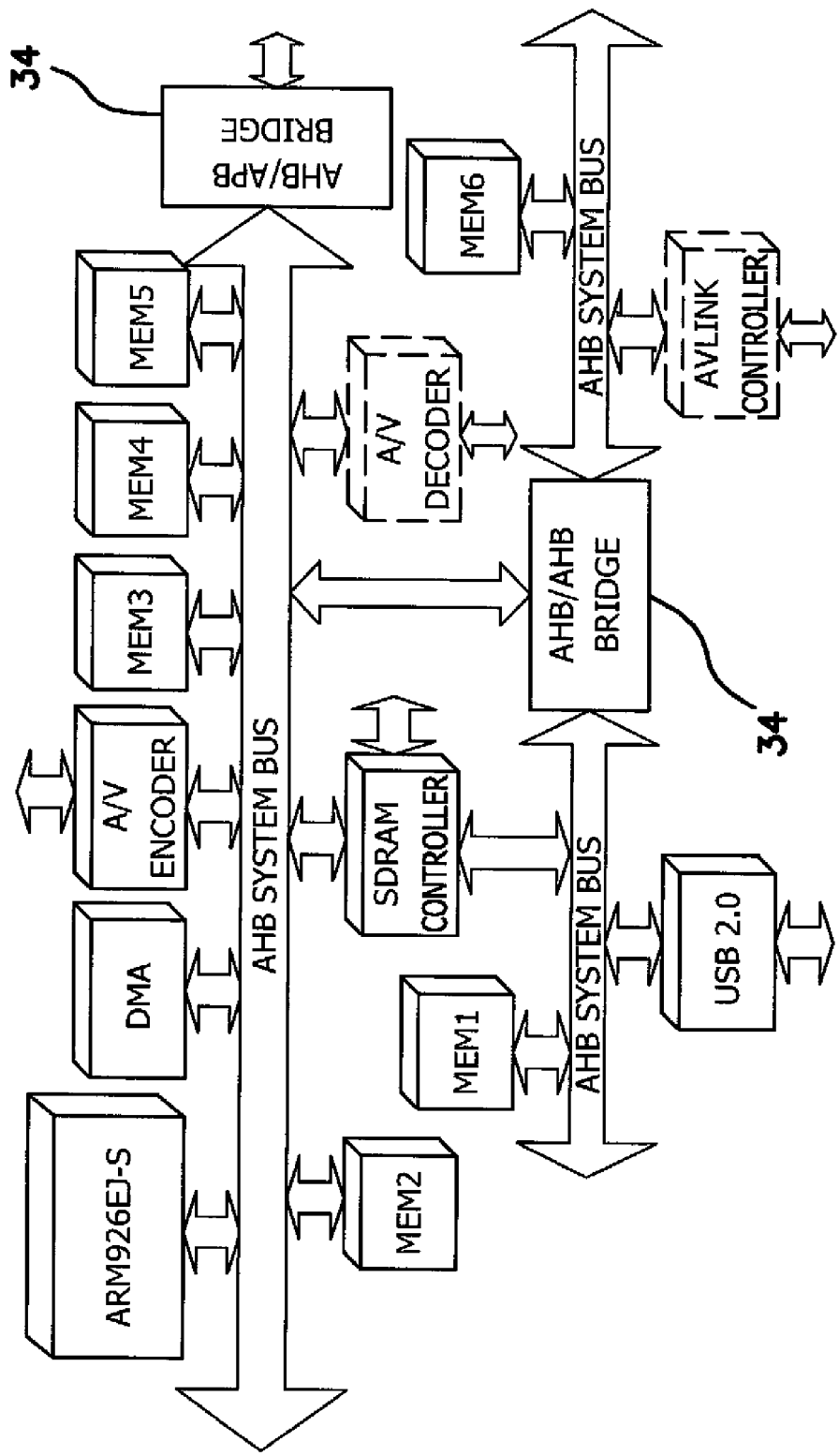

Statistics gathered during simulation indicate that the A/V decoder frequently communicates with the ARM CPU and the DMA. Therefore with the intention of improving performance even further we allocate the high bandwidth USB and AVLink controller components to separate AHB busses, and bring the A/V decoder to the main bus. FIG. 14d is a schematic block diagram which shows the modified architecture Arch4. Performance figures from the table indicate that the SP1 scheme performs better than the rest of the schemes. This is because the SP scheme works well when requests from the high bandwidth components are infrequent (since they have been allocated on separate busses). The TDMA schemes suffer because of several wasted slots for the USB and AVLink controller, which are inefficiently allocated by the secondary RR scheme.

We thus arrive at the Arch4 topology of FIG. 14d together with the SP1 arbitration scheme as the best choice for the new version of the SoC design. We arrived at this choice after evaluating several other combinations of topology/arbitration schemes not shown here due to lack of space. It took us less than a day to evaluate these different communication design space points with our CCATB models and our results were verified by simulating the system with a more detailed pin accurate BCA model. It would have taken much longer to model and simulate the system with other approaches. The next section quantifies the gains in simulation speed and modeling effort for the CCATB modeling abstraction, when compared with other models.

Simulation And Modeling Effort Comparison

Figure 15:
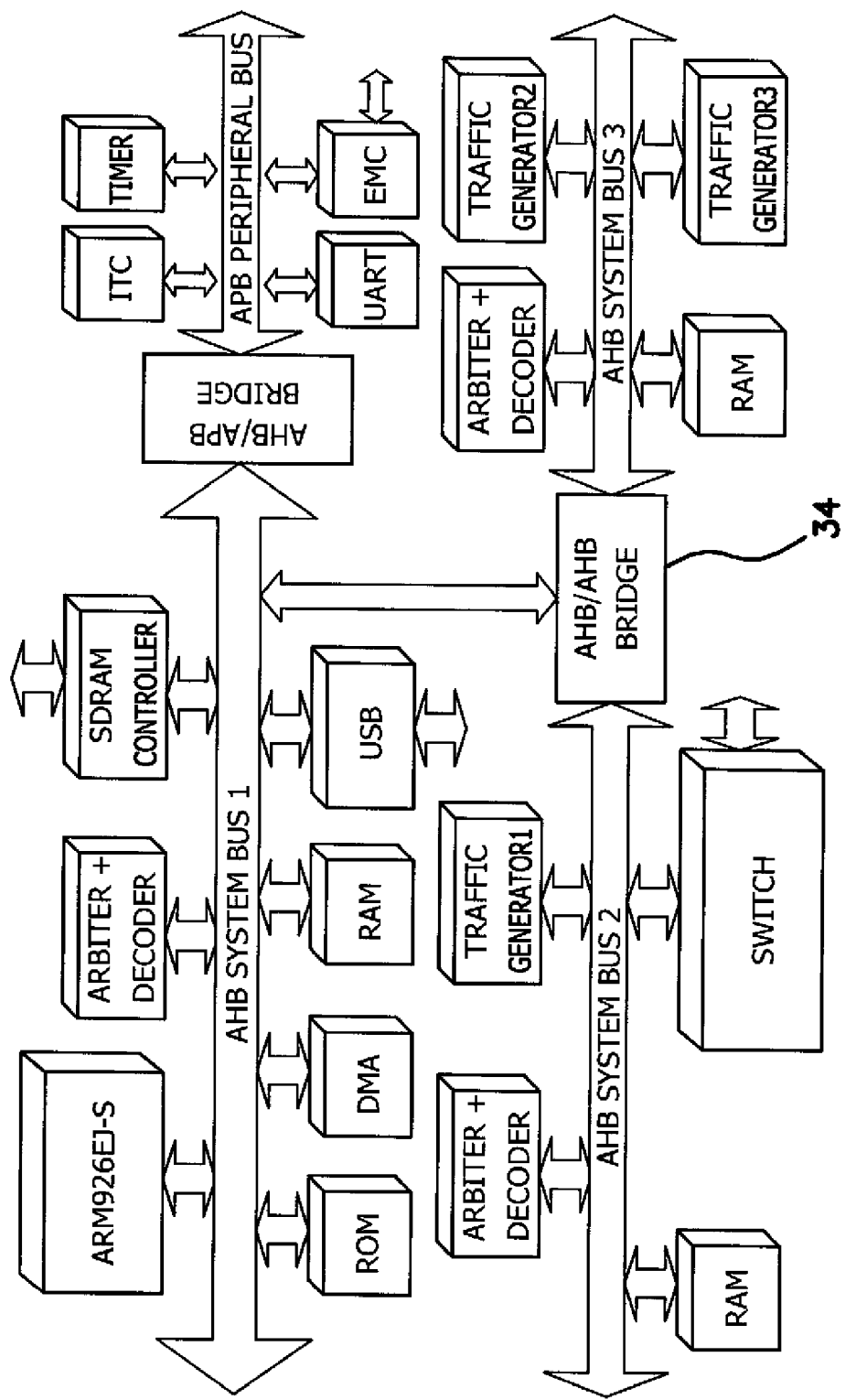
FIG. 15 is a schematic diagram of a SoC platform used for comparison of the modeling effort and simulation performance for pin accurate backup domain controller (BDC), transaction based BCA and the CCATB model of the invention.

We now present a comparison of the modeling effort and simulation performance for pin accurate BCA (PA-BCA), transaction based BCA (T-BCA) and our CCATB models. For the purpose of this study we chose the SoC platform shown in the schematic block diagram of FIG. 15. This platform is similar to the one we used for exploration in the previous section but is more generic and is not restricted to the multimedia domain. It is built around the AMBA 2.0 communication architecture and has an ARM926 processor ISS model with a test program running on it which initializes different components and then regulates data flow to and from the external interfaces such as USB, switch, external memory controller (EMC) and the SDRAM controller.

Figure 16:
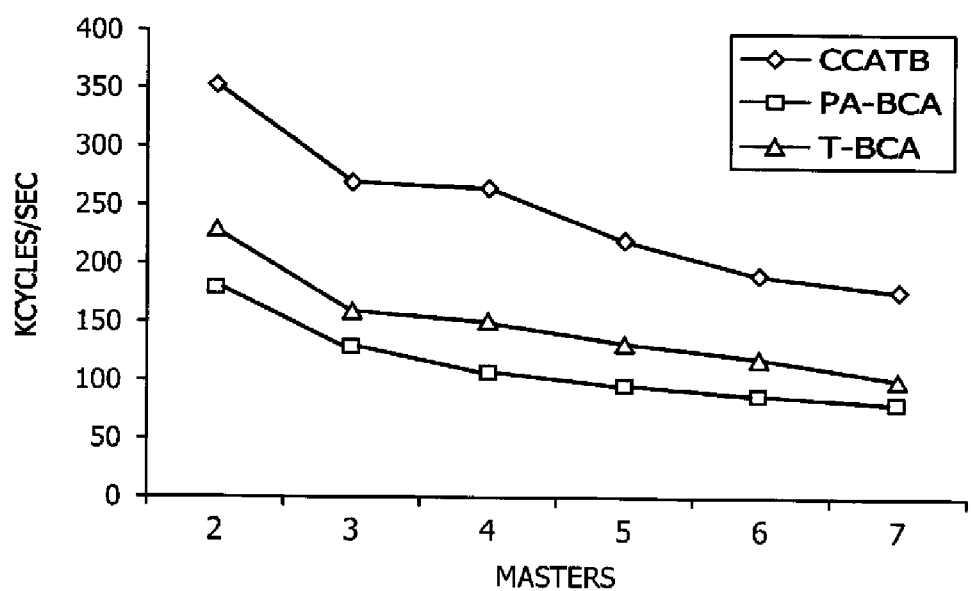
FIG. 16 is a graph of the simulation speed comparison for pin accurate BDC, transaction based BCA and the CCATB model of the invention as a function of increasing complexity as given by an increasing number of masters in the system of FIG. 15.

For the T-BCA model we chose the approach from the AHB CLI specification. Our goal was to compare not only the simulation speeds but also to ascertain how the speed changed with system complexity. We first compared speedup for a 'lightweight' system comprising of just 2 traffic generator masters along with peripherals used by these masters, such as the RAM and the EMC. We gradually increased system complexity by adding more masters and their slave peripherals. FIG. 16 is a graph which shows the simulation speed comparison with increasing design complexity.

Note the steep drop in simulation speed when the third master was added—this is due to the detailed non-native SystemC model of the ARM926 processor which considerably slowed down simulation. In contrast, the simulation speed was not affected as much when the DMA controller was added as the fourth master. This was because the DMA controller transferred data in multiple word bursts which can be handled very efficiently by the transaction based T-BCA and CCATB models. The CCATB particularly handles burst mode simulation very effectively and consequently has the least degradation in performance out of the three models. Subsequent steps added the USB switch and another traffic generator which put considerable communication traffic and computation load on the system, resulting in a reduction in simulation speed. Overall, the CCATB abstraction level outperforms the other two models. Table 3 gives the average speedup of the CCATB over the PA-BCA and T-BCA models. We note that on average, CCATB is faster than T-BCA by 67% and even faster than PA-BCA models by 120%.

TABLE 3

| Model Abstraction | Average CCATB speedup (x times) | Modeling Effort |
|---|---|---|
| CCATB | 1 | ~3 days |
| T-BCA | 1.67 | ~4 days |
| PA-BCA | 2.2 | ~1.5 wks |

Table 3 also shows the time taken to model the communication architecture at the three different abstraction levels by a designer familiar with AMBA 2.0. While the time taken to capture the communication architecture and model the interfaces took just 3 days for the CCATB model, it took a day more for the transaction based BCA, primarily due to the additional modeling effort to maintain accuracy at cycle boundaries for the bus system. It took almost 1.5 weeks to capture the PA-BCA model. Synchronizing and handling the numerous signals and design verification were the major contributors for the additional design effort in these models. In summary, CCATB models are faster to simulate and need less modeling effort compared to T-BCA and PA-BCA models.

Early exploration of System-on-chip communication architectures is extremely important to ensure efficient implementation and for meeting performance constraints. We have presented the Cycle Count Accurate at Transaction Boundaries (CCATB) modeling abstraction which is a fast, efficient and flexible approach for exploring the vast communication space for shared-bus architectures in SoC designs. Our model enables plug-and-play exploration of various facets of the communication space, allowing master, slave and bus IPs to be easily replaced with their architecture variants, and quickly estimating the impact on system performance. We also propose a five layer design methodology that incorporates our CCATB abstraction level. Interface refinement from higher abstraction levels to lower levels is simplified as we avoid altering the interface between IPs and the communication channel as much as possible. This also eases co-simulation of SoC IPs modeled at different abstraction levels in our system flow. We described the mechanisms responsible for speedup at the CCATB modeling abstraction, which enable fast and efficient exploration of the communication design space, early in the design flow. We have successfully applied our approach for exploring several industrial strength SoC subsystems. Two such exploration case studies from the broadband communication and multimedia domains, were presented above. We also showed that the CCATB models are faster to simulate than pin-accurate BCA (PA-BCA) models by as much as 120% on average and are also faster than transaction based BCA (T-BCA) models by 67% on average. In addition, the CCATB models take less time to model than T-BCA and PA-BCA models. The invention contemplates and includes automatic refinement of CCATB models from high level TLM models and interface refinement from CCATB down to the pin accurate BCA abstraction level for RTL co-simulation purposes.

Many alterations and modifications may be made by those having ordinary skill in the art without departing from the spirit and scope of the invention. For example, Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. A method for exploring performance of a communication protocol in a computer system having a plurality of components comprising the steps of:
    selecting a communication architecture;
    configuring the communication architecture to meet design performance requirements; and
    simulating performance of all of the plurality of components combined in the computer system with the selected communication architecture at a transaction-based modeling abstraction level using a Cycle Count Accurate at Transaction Boundaries (CCATB) model.

2. The method of claim 1 where configuring the communication architecture to meet design performance requirements comprises the step of configuring bus topology, data bus width, arbitration protocols, direct memory access (DMA) burst lengths or buffer sizes to meet design performance requirements.

3. The method of claim 1 where simulating performance of all of the plurality of components comprises the step of modeling CPUs, memories and peripherals in the computer system with appropriate parameters, annotated with timing details and modeled at a granularity which captures the functionality of the CPUs, memories and peripherals.

4. The method of claim 1 where simulating performance of all of the plurality of components comprises the step of modeling performance bus features.

5. The method of claim 3 where modeling performance bus features comprises the step of modeling performance components at different abstraction levels by use of an appropriate wrapper to interface with the Cycle Count Accurate at Transaction Boundaries (CCATB) model.

6. The method of claim 5 where the computer system includes a CPU architecture and where modeling performance components comprises the step of simulating the working of the computer system including running embedded software on a corresponding CPU architecture model.

7. The method of claim 5 further comprising the step of reusing modeled components to amortize design effort over a range of architecture derivatives.

8. The method of claim 5 where modeling performance components at different abstraction levels by use of an appropriate wrapper to interface with the Cycle Count Accurate at Transaction Boundaries (CCATB) model comprises the step of modeling performance components independently of the underlying architecture to allow plug-and-play of a plurality of on-chip communication architectures.

9. The method of claim 1 where simulating performance of all of the plurality of components combined in the computer system comprises the step refining higher level (timing-independent) Transaction Level modeling (TLM) models to lower level cycle/pin-accurate models, and avoiding modeling protocol signals due to simulation overhead.

10. The method of claim 1 where simulating performance of all of the plurality of components combined in the computer system with the selected communication architecture at a transaction-based modeling abstraction level using a Cycle Count Accurate at Transaction Boundaries (CCATB) model comprises the step of simulating performance of a read or write operation issued by a master to a slave, that can either be a single data word or a multiple data burst transfer.

11. The method of claim 10 simulating performance of a read or write operation comprises the step of passing bus protocol specific control and timing information.

12. The method of claim 1 where simulating performance of all of the plurality of components comprises the step of maintaining cycle count accuracy at transaction boundaries.

13. The method of claim 12 where maintaining cycle count accuracy at transaction boundaries comprises the step of maintaining the number of bus cycles that elapse at the end of a transaction the same as when compared to cycles elapsed in a detailed cycle/pin accurate system model.

14. The method of claim 13 where maintaining the number of bus cycles comprises the step of maintaining overall cycle count accuracy needed to gather statistics for accurate communication space exploration, while optimizing the models for simulation.

15. The method of claim 1 where simulating performance of all of the plurality of components comprises the step of simulating performance of all of the plurality of components using SystemC modeling language.

16. The method of claim 1 where simulating performance of all of the plurality of components comprises the step of simulating performance bus architectures by extending a generic Transaction Level modeling (TLM) channel model to include bus architecture specific timing and protocol details, integrating arbiter and decoder modules with the channel model, and modeling computation blocks (masters and slaves) at a behavioral abstraction level.

17. The method of claim 16 where modeling computation blocks (masters and slaves) at a behavioral abstraction level comprises the step of refining a master IP (intellectual property) by setting protocol specific parameters before calling interface functions.

18. The method of claim 16 where the slaves have a slave IP and where modeling computation blocks (masters and slaves) at a behavioral abstraction level comprises the step of adding model refinement when the slave IP supports special bus protocol specific features.

19. The method of claim 16 where the slaves have a slave IP with an interface, the masters have a master IP with a different interface, and where modeling computation blocks (masters and slaves) at a behavioral abstraction level comprises the step of using an adapter to interface the different interfaces.

20. The method of claim 1 where the computer system comprises a plurality of computer subsystems coupled by a plurality of bridges and where selecting a communication architecture comprises the step of selecting a communication architecture defined by the plurality of computer subsystems coupled by the plurality of bridges.

21. The method of claim 1 where simulating performance of all of the plurality of components combined in the computer system comprises the step of simulating performance during which unnecessary invocation of simulation components is prevented and during which idle time is efficiently handled.

22. The method of claim 21 where simulating performance during which unnecessary invocation of simulation components is prevented and during which idle time is efficiently handled comprises the step of handling all the delays in a transaction in a bus module without repeatedly invoking other parts of the computer system on every cycle (master and slave threads and processes) which would otherwise contribute to simulation overhead.

23. A method for exploring performance of a communication protocol in a computer system having a plurality of components comprising the steps of:
 algorithmically characterizing a specification model of the computer system independently of any hardware architecture employed in the computer system;
 connecting together high level functional blocks representing hardware components using a bus architecture-independent generic channel for early embedded software development and high-level platform validation;
 annotating the bus architecture-independent generic channel with timing and protocol details to define an interface between the bus architecture-independent generic channel and functional blocks representing hardware components;
 refining the interface to obtain a Cycle Count Accurate at Transaction Boundaries (CCATB) model for communication space and system performance exploration;
 decomposing read( ) and write( ) interface calls into several method calls which correspond to bus pins to obtain observable cycle accuracy for system debugging and validation and to obtain a cycle accurate model; and
 replacing the method calls by signals and further refining the functional blocks representing hardware components to obtain pin/cycle-accurate models which can be manually or automatically mapped to RTL, or be used to co-simulate with existing RTL components for better simulation performance while validating system design at a low level.

24. The method of claim 23 where decomposing read( ) and write( ) interface calls comprises the step of passing bus-architecture specific control information through the read( ) write( ) channel interface.

25. An apparatus for exploring performance of a communication protocol in a computer system having a plurality of components comprising means for simulating performance of all of the plurality of components combined in the computer system with a selected communication architecture at a transaction-based modeling abstraction level using a Cycle Count Accurate at Transaction Boundaries (CCATB) model, including a means for simulating performance of a read or write operation issued by a master to a slave, that can either be a single data word or a multiple data burst transfer and means for passing bus protocol specific control and timing information.

26. The apparatus of claim 25 where the means for simulating performance of all of the plurality of components comprises means for maintaining cycle count accuracy at transaction boundaries.

27. The apparatus of claim 26 where the means for maintaining cycle count accuracy at transaction boundaries comprises means for maintaining the number of bus cycles that elapse at the end of a transaction the same as when compared to cycles elapsed in a detailed cycle/pin accurate system model.

28. The apparatus of claim 27 where the means for maintaining the number of bus cycles comprises means for maintaining overall cycle count accuracy needed to gather statistics for accurate communication space exploration, while optimizing the models for simulation.

29. The apparatus of claim 25 where the means for simulating performance of all of the plurality of components comprises means for simulating performance of all of the plurality of components using SystemC modeling language.

30. The apparatus of claim 25 where the means for simulating performance of all of the plurality of components comprises means for simulating performance bus architectures by extending a generic Transaction Level modeling (TLM) channel model to include bus architecture specific timing and protocol details, means for integrating arbiter and decoder modules with the channel model, and means for modeling computation blocks (masters and slaves) at a behavioral abstraction level.

31. The apparatus of claim 30 where the means for modeling computation blocks (masters and slaves) at a behavioral abstraction level comprises means for refining a master IP (intellectual property) by setting protocol specific parameters before calling interface functions.

32. The apparatus of claim 30 where the slaves have a slave IP and where means for modeling computation blocks (masters and slaves) at a behavioral abstraction level comprises means for adding model refinement when the slave IP supports special bus protocol specific features.

33. The apparatus of claim 30 where the slaves have a slave IP with an interface, the masters have a master IP with a different interface, and where the means for modeling computation blocks (masters and slaves) at a behavioral abstraction level comprises means for using an adapter to interface the different interfaces.

34. The apparatus of claim 25 where the computer system comprises a plurality of computer subsystems coupled by a plurality of bridges and where the architecture is defined by the plurality of computer subsystems coupled by the plurality of bridges.

35. The apparatus of claim 25 where the means for simulating performance of all of the plurality of components combined in the computer system comprises means for simulating performance during which unnecessary invocation of simulation components is prevented and during which idle time is efficiently handled.

36. The apparatus of claim 35 where the means for simulating performance during which unnecessary invocation of simulation components is prevented and during which idle time is efficiently handled comprises means for handling all the delays in a transaction in a bus module without repeatedly invoking other parts of the computer system on every cycle (master and slave threads and processes) which would otherwise contribute to simulation overhead.

37. An apparatus for exploring performance of a communication protocol in a computer system having a plurality of components comprising:
  means for algorithmically characterizing a specification model of the computer system independently of any hardware architecture employed in the computer system;
  means for connecting together high level functional blocks representing hardware components using a bus architecture-independent generic channel for early embedded software development and high-level platform validation;
  means for annotating the bus architecture-independent generic channel with timing and protocol details to define an interface between the bus architecture-independent generic channel and functional blocks representing hardware components;
  means for refining the interface to obtain a Cycle Count Accurate at Transaction Boundaries (CCATB) model for communication space and system performance exploration;
  means for decomposing read( ) and write( ) interface calls into several apparatus calls which correspond to bus pins to obtain observable cycle accuracy for system debugging and validation and to obtain a cycle accurate model; and
  means for replacing the apparatus calls by signals and further refining the functional blocks representing hardware components to obtain pin/cycle-accurate models which can be manually or automatically mapped to RTL, or be used to co-simulate with existing RTL components for better simulation performance while validating system design at a low level.

38. The apparatus of claim 37 where the means for decomposing read( ) and write( ) interface calls comprises means for passing bus-architecture specific control information through the read( ) write( ) channel interface.

* * * * *